(12) United States Patent
Liaw et al.

(10) Patent No.: US 10,014,066 B2
(45) Date of Patent: Jul. 3, 2018

(54) ANTI-FUSE CELL STRUCTURE INCLUDING READING AND PROGRAMMING DEVICES WITH DIFFERENT GATE DIELECTRIC THICKNESS

(71) Applicant: Taiwan Semiconductor Manufacturing Company, Ltd., Hsin-Chu (TW)

(72) Inventors: Jhon Jhy Liaw, Zhudong Township (TW); Shien-Yang Wu, Jhudong Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/004,329

(22) Filed: Jan. 22, 2016

(65) Prior Publication Data

US 2017/0154686 A1   Jun. 1, 2017

Related U.S. Application Data

(60) Provisional application No. 62/260,841, filed on Nov. 30, 2015.

(51) Int. Cl.
*G11C 17/00* (2006.01)
*G11C 17/18* (2006.01)
(Continued)

(52) U.S. Cl.
CPC ............ *G11C 17/18* (2013.01); *H01L 23/528* (2013.01); *H01L 23/5252* (2013.01);
(Continued)

(58) Field of Classification Search
CPC ............ H01L 27/112; H01L 23/5252; H01L 27/11206; H01L 29/94; H01L 29/7851;
(Continued)

(56) References Cited

U.S. PATENT DOCUMENTS 6,580,145 B2   6/2003   Wu et al.
7,796,460 B2   9/2010   Matsufuji et al.
(Continued)

FOREIGN PATENT DOCUMENTS

JP   2009004578 A   1/2009
KR   20120020272 A   3/2012
(Continued)

*Primary Examiner* — David Lam
(74) *Attorney, Agent, or Firm* — Slater Matsil, LLP

(57) ABSTRACT

A structure includes a word-line, a bit-line, and an anti-fuse cell. The anti-fuse cell includes a reading device, which includes a first gate electrode connected to the word-line, a first gate dielectric underlying the first gate electrode, a drain region connected to the bit-line, and a source region. The first gate dielectric has a first thickness. The drain region and the source region are on opposite sides of the first gate electrode. The anti-fuse cell further includes a programming device including a second gate electrode connected to the word-line, and a second gate dielectric underlying the second gate electrode. The second gate dielectric has a second thickness smaller than the first thickness. The programming device further includes a source/drain region connected to the source region of the reading device.

19 Claims, 30 Drawing Sheets

(51) Int. Cl.

| | | |
|---|---|---|
| *H01L 23/525* | (2006.01) | |
| *H01L 23/528* | (2006.01) | |
| *H01L 29/78* | (2006.01) | |
| *H01L 29/94* | (2006.01) | |
| *G11C 17/16* | (2006.01) | |
| *H01L 27/112* | (2006.01) | |

(52) U.S. Cl.
CPC .... *H01L 27/11206* (2013.01); *H01L 29/7851* (2013.01); *H01L 29/94* (2013.01); *G11C 17/16* (2013.01); *H01L 27/112* (2013.01)

(58) Field of Classification Search
CPC ....... H01L 23/528; G11C 17/18; G11C 17/16; G11C 17/165
USPC ................. 365/96, 225.7; 257/530, E23.147
See application file for complete search history.

(56) References Cited

U.S. PATENT DOCUMENTS

| | | | |
|---|---|---|---|
| 8,089,798 B2 | 1/2012 | Lai et al. | |
| 8,421,205 B2 | 4/2013 | Yang | |
| 8,547,763 B2* | 10/2013 | Son | G11C 17/16 365/185.01 |
| 8,661,389 B2 | 2/2014 | Chern et al. | |
| 8,698,205 B2 | 4/2014 | Tzeng et al. | |
| 8,724,363 B2* | 5/2014 | Lu | H01L 27/11206 365/94 |
| 8,826,212 B2 | 9/2014 | Yeh et al. | |
| 8,836,141 B2 | 9/2014 | Chi et al. | |
| 9,041,115 B2 | 5/2015 | Liaw | |
| 9,196,377 B1* | 11/2015 | Park | H01L 27/11206 |
| 9,490,027 B2* | 11/2016 | Song | G11C 17/16 |
| 2008/0316852 A1 | 12/2008 | Matsufuji et al. | |
| 2009/0180307 A1* | 7/2009 | Kurjanowicz | G11C 17/10 365/96 |
| 2009/0250726 A1* | 10/2009 | Kurjanowicz | H01L 23/5252 257/209 |
| 2010/0232203 A1 | 9/2010 | Chung et al. | |
| 2012/0039107 A1 | 2/2012 | Chung | |
| 2012/0051164 A1 | 3/2012 | Son et al. | |
| 2012/0211843 A1 | 8/2012 | Jung et al. | |
| 2013/0292777 A1 | 11/2013 | Liaw | |
| 2014/0215420 A1 | 7/2014 | Lin et al. | |
| 2014/0264924 A1 | 9/2014 | Yu et al. | |
| 2014/0282289 A1 | 9/2014 | Hsu et al. | |
| 2014/0325466 A1 | 10/2014 | Ke et al. | |
| 2014/0346603 A1* | 11/2014 | Toh | H01L 27/11206 257/350 |
| 2015/0200196 A1* | 7/2015 | Ponoth | H01L 23/5252 257/379 |
| 2015/0243366 A1 | 8/2015 | Wu et al. | |
| 2016/0013193 A1* | 1/2016 | Wu | G11C 16/08 365/96 |

FOREIGN PATENT DOCUMENTS

| | | |
|---|---|---|
| KR | 20120094822 A | 8/2012 |
| KR | 20140080475 A | 6/2014 |

* cited by examiner

ANTI-FUSE CELL STRUCTURE INCLUDING READING AND PROGRAMMING DEVICES WITH DIFFERENT GATE DIELECTRIC THICKNESS

PRIORITY CLAIM AND CROSS-REFERENCE

This application claims the benefit of the following provisionally filed U.S. Patent application: Application Ser. No. 62/260,841, filed Nov. 30, 2015, and entitled "Anti-Fuse Cell Structure;" which application is hereby incorporated herein by reference.

BACKGROUND

Anti-fuse memories include memory cells, whose terminals are disconnected before programming, and are shorted/connected after the programming. The anti-fuse memories may be based on Metal-Oxide Semiconductor (MOS) technology, wherein the gate dielectrics of MOS capacitors/transistors may be broken down to cause the gate and the source/drain regions of a programming capacitor/transistor to be interconnected. Anti-fuse cells have the advantageous features of reverse-engineering proofing, since the programming states of the anti-fuse cells cannot be determined through reverse engineering.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
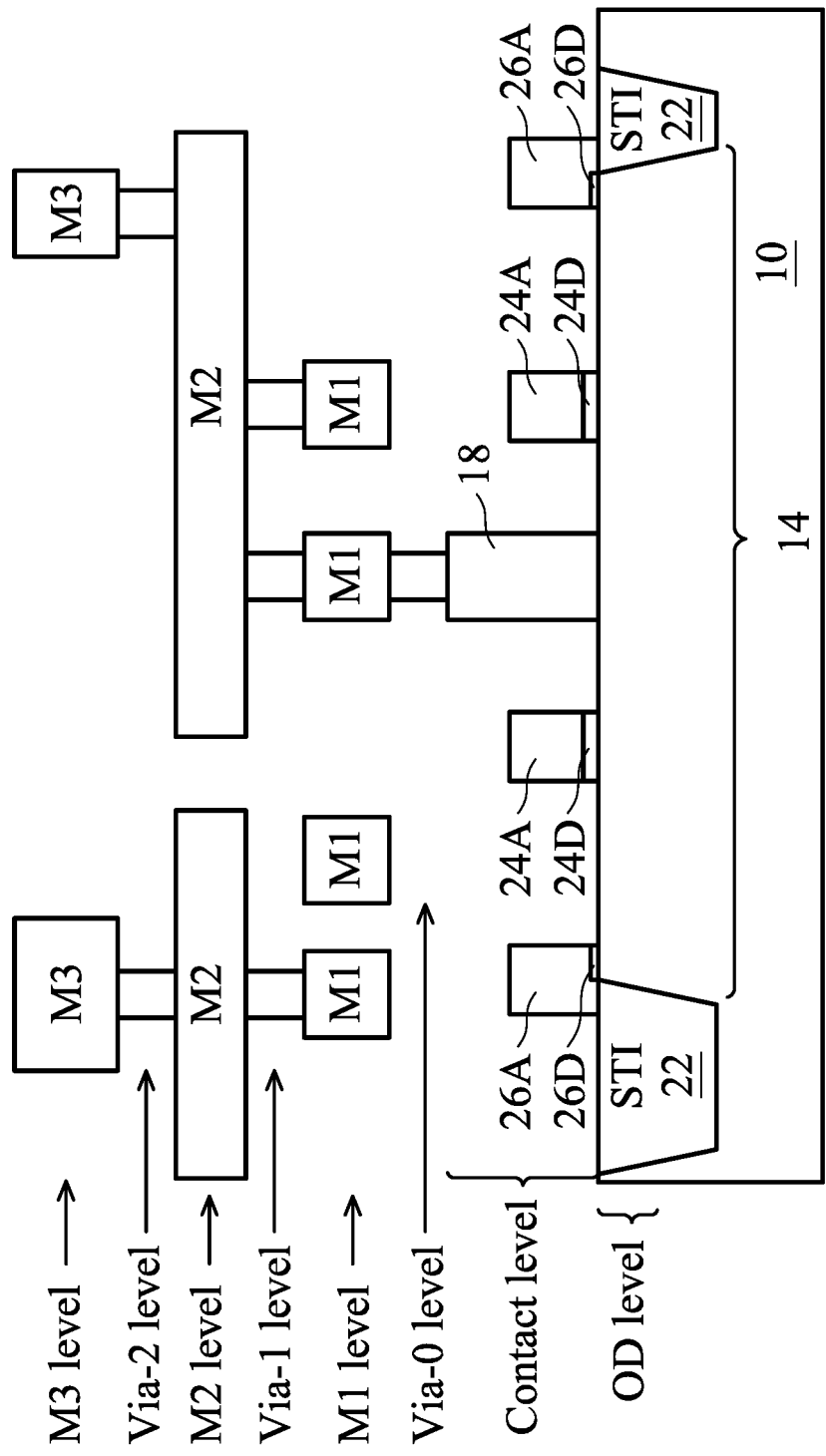
FIG. 1 illustrates a schematic cross-sectional view of various levels of devices and the features in different levels in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An anti-fuse and the method of operating the same are provided in accordance with various exemplary embodiments. Some variations of some embodiments are discussed. Throughout the various views and illustrative embodiments, like reference numbers are used to designate like elements.

FIG. 1 schematically illustrates the features and the respective levels discussed throughout the description. Each of the levels includes one or more dielectric layers and/or the conductive features formed therein. The conductive features that are at the same level may have top surfaces substantially level to each other, and bottom surfaces substantially level to each other, and may be formed simultaneously. For example, there is an OD level, in which ODs (active regions) 14 are located. A "contact level" is over the OD level, wherein contact plugs 18 are formed in the contact level. The features in the contact level also include gate dielectrics 24D and 26D and gate electrodes 24A and 26A. Over the contact level resides via-0 level, M1 level, via-1 level, M2 level, via-2 level, and M3 level. In subsequent discussion, when features are discussed, their levels may be found referring to their names and their reference numerals in FIG. 1. The reference numerals of the features throughout the description may be referred to using the references numerals in FIG. 1 followed by sign "–" and a number. For example, when a feature is denoted as M1 followed by sign "–" and a number, it indicates this feature is one of the features in the M1 level. When a feature is denoted as "via-0" followed by sign "–" and a number, it indicates this feature is one of the active regions.

Figure 9:
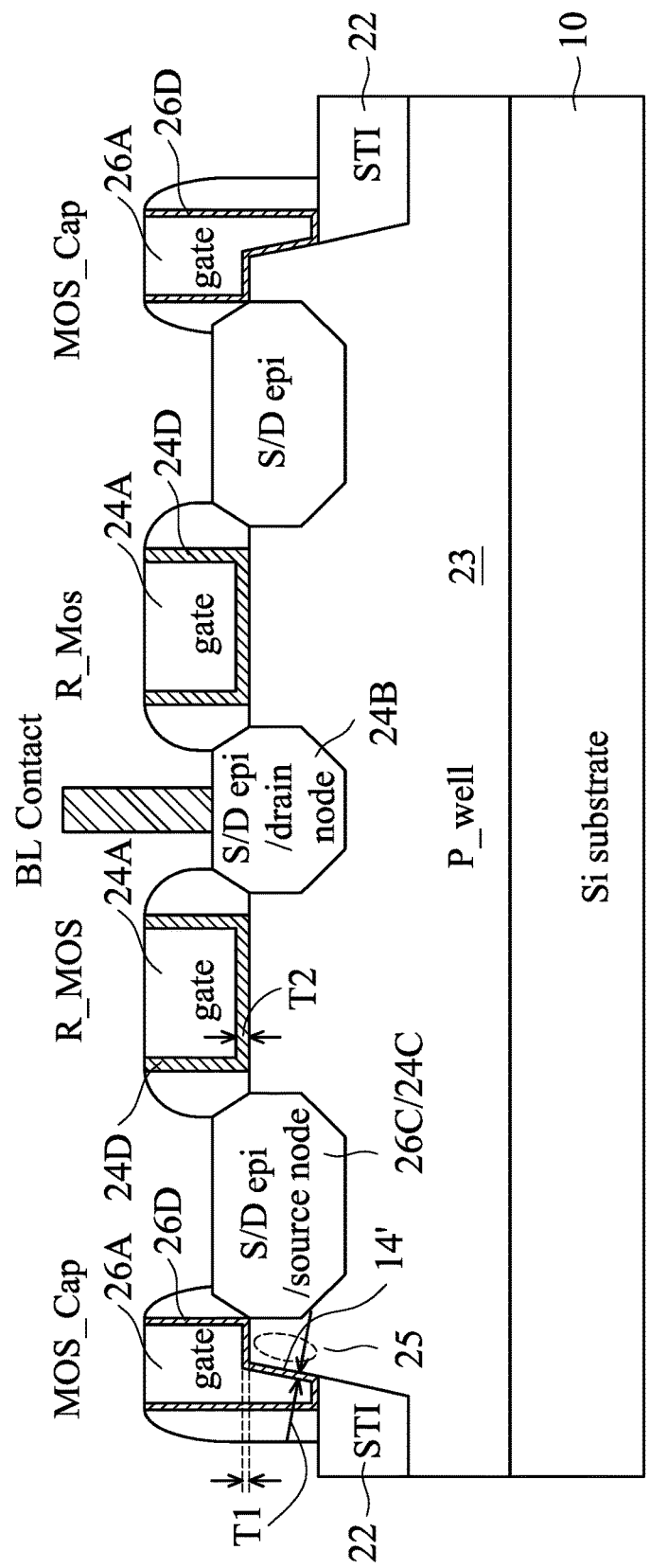

Referring further to FIG. 1, substrate 10 is provided. Substrate 10 may be a silicon substrate or a substrate formed of any other applicable semiconductor materials. Isolation regions such as Shallow Trench Isolation (STI) regions 22 are formed extending into substrate 10. Active regions (OD) 14, which are portions of substrate 10, are defined by STI regions 22. In FIG. 1, the top surfaces of STI regions 22 are illustrated as coplanar with the top surface of substrate 10. The respective Metal-Oxide-Semiconductor (MOS) devices are planar MOS devices. In accordance with alternative embodiments, STI regions 22 may be recessed, as shown in FIG. 9, and the respective action regions 14 are semiconductor fins. The respective MOS devices are Fin Field Effect Transistors (FinFETs) or fin-based capacitors.

FIG. 1 also illustrates gate dielectric 26D and gate electrode 26A, which form a part of a MOS capacitor (referred to as MOS_Cap throughout the description). Furthermore, gate dielectric 24D and gate electrode 24A form parts of a reading MOS (referred to as R_Mos throughout the description). The MOS_Cap and the R_Mos in combination form an anti-fuse cell.

Contact plugs 18 are formed at a level underlying the via-0 level, and are used to connect the vias in via-0 level to the underlying features such as the gates or the source/drain regions of the MOS capacitors and the reading devices.

Figure 2A:
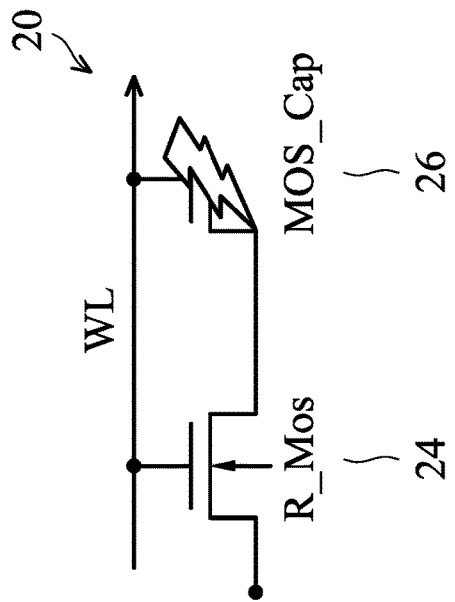
FIGS. 2A, 2B, and 2C illustrate the schematic diagrams of an anti-fuse cell in various stages in accordance with some embodiments.
Figure 2B:
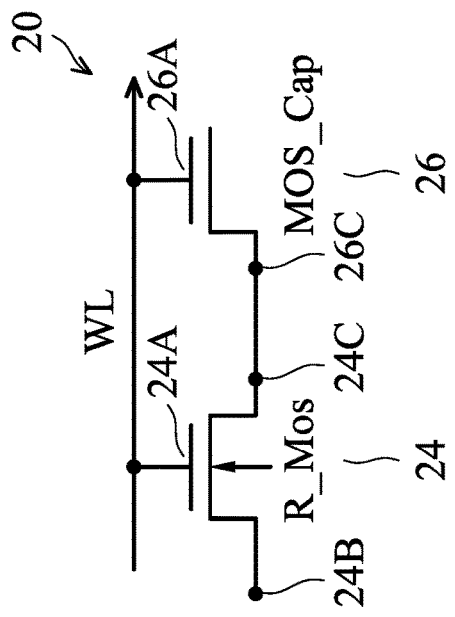
Figure 2C:
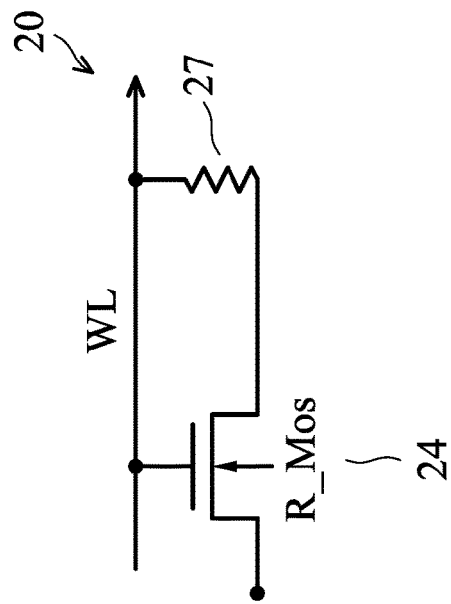

FIG. 2A illustrates a schematic diagram of anti-fuse cell 20, which includes R_Mos 24 and MOS_cap 26. MOS_cap 26 is a partial MOS having two terminals, including source/drain region 26C and gate 26A. Gate 24A of R_Mos 24 and gate 26A of MOS_cap 26 are connected to a common word-line WL. The source 24C of R_Mos 24 is connected to source/drain region 26C of MOS_cap 26. Before being programmed, the opposite terminals 26A and 26C of MOS_cap 26 are electrically disconnected, and currents cannot flow through MOS_cap 26. Referring to FIG. 2B, when a high voltage is applied on the opposite terminals 26A and 26C of MOS_cap 26, the gate dielectric of MOS_cap 26 is broken down. The behavior of the portion of the structure interconnecting terminals 26A and 26C is resistive, and terminals 26A and 26C are equivalently connected through resistor 27 (FIG. 2C), whose resistance is the resistance of the broken-down gate dielectric and the resistance of the channel region therebetween.

Figure 3B:
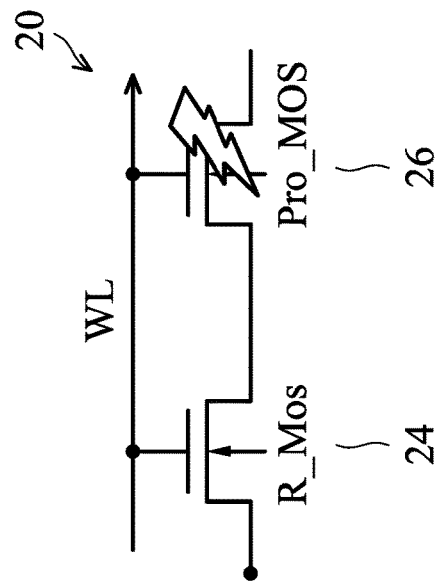
FIGS. 3A, 3B, and 3C illustrate the schematic diagrams of an anti-fuse cell in various stages in accordance with some embodiments.
Figure 3C:
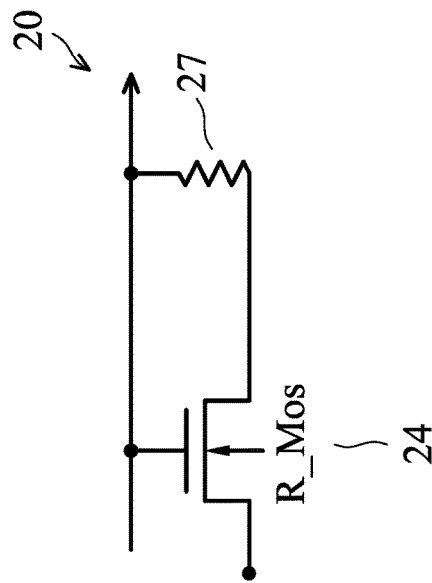
Figure 3A:
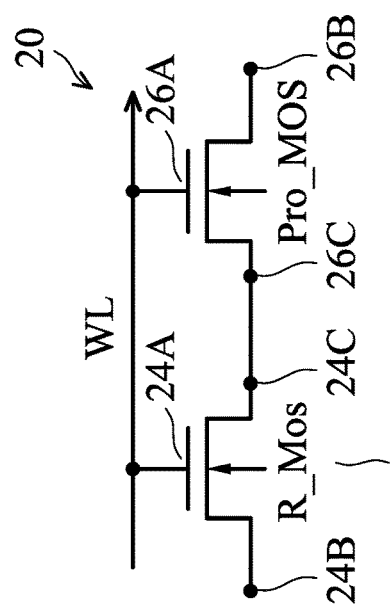

FIG. 3A illustrates a schematic diagram of anti-fuse cell 20 in accordance with some embodiments. The anti-fuse cell 20 in accordance with these embodiments is similar to the anti-fuse cell 20 in FIG. 2A, except MOS_cap 26 in FIG. 2A is a programming MOS (Pro_MOS) 26 having three terminals in FIG. 3A. The three terminals include gate 26A, source/drain 26C, and source/drain 26B. Source/drain 26B may be electrically floating (unconnected). Pro_MOS 26 is also used as a programming capacitor, and may sometimes be referred to as MOS_Cap throughout the description. Again, gate 24A of R_Mos 24 and gate 26A of Pro_MOS 26 are connected to a common word-line WL. The source 24C of R_Mos 24 is connected to source/drain region 26C of Pro_MOS 26. Before being programmed, the opposite terminals 26A and 26C of Pro_MOS 26 are electrically disconnected, and currents cannot flow through Pro_MOS. Referring to FIG. 3B, when a voltage that is high enough is applied on the opposite terminals 26A and 26C of Pro_MOS, the gate dielectric of Pro_MOS 26 is broken down, and the opposite terminals 26A and 26C of Pro_MOS are electrically connected through equivalent resistor 27 (FIG. 3C).

Figure 4:
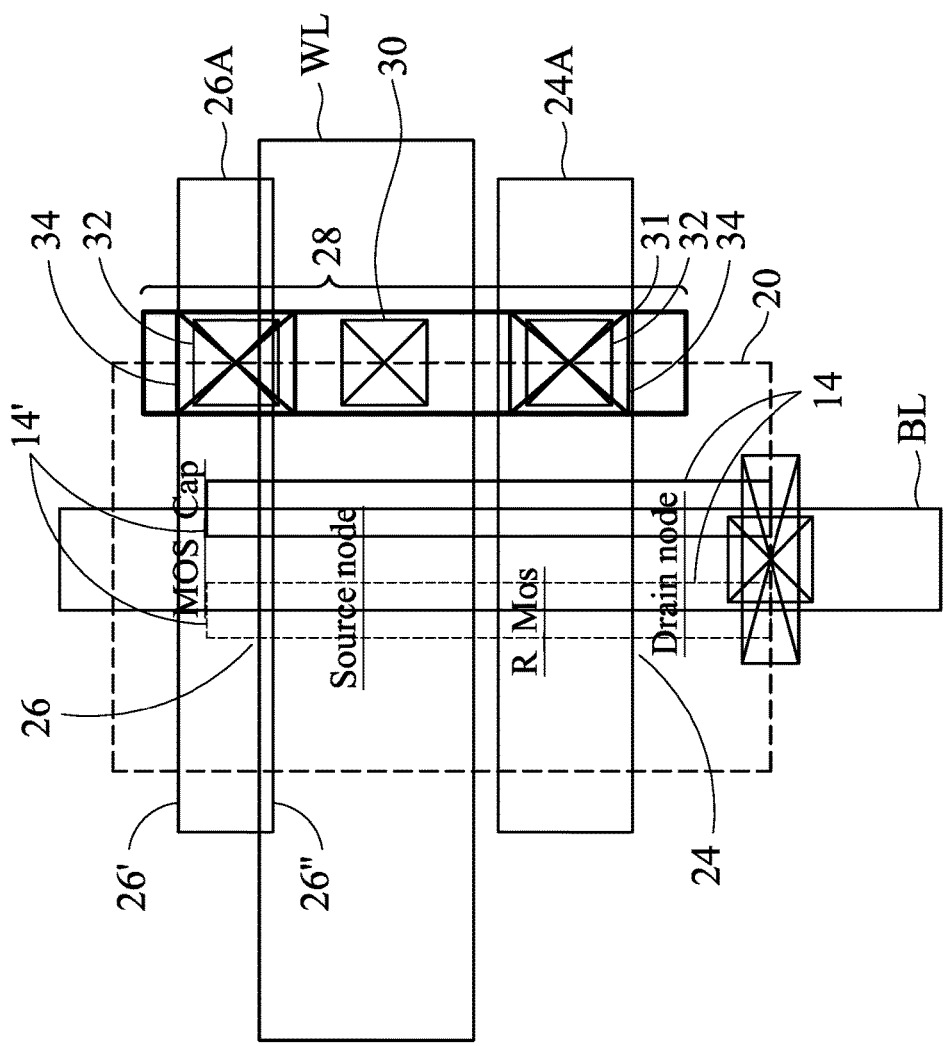
FIG. 4 illustrates the layout of a single anti-fuse cell in accordance with some embodiments.

FIG. 4 illustrates a layout of anti-fuse cell 20 in accordance with some embodiments. The dotted lines marking a rectangular region represent the boundaries of anti-fuse cell 20. Anti-fuse cell 20 includes active regions 14 (which may be semiconductor fins), gate electrode 24A, and gate electrode 26A. There may be a single fin, two fins, or three fins, wherein one of the fins 14 is illustrated as dotted to indicate it may or may not exist. Gate electrode 24A, active regions 14, the source node, and the drain node in combination form R_MOS 24. Gate electrode 26A, active regions 14, and the source node in combination form MOS_Cap 26.

In accordance with some embodiments, ends 14' (sidewalls) of active regions 14 are overlapped by gate electrode 26A. Active regions 14 thus do not extend across gate electrode 26A. Alternatively stated, ends 14' of active regions 14 terminate between the opposite edges 26' and 26" of gate electrode 26A. Hence, MOS_Cap 26 is a two-terminal device, and has a single source/drain region.

Gate electrodes 24A and 26A are electrically connected to the same word-line WL through connection module 28. Word-line WL may be in the M2 level (FIG. 1). Word-line WL is connected to the underlying via 30, which is at via-1 level. Metal line 31, which is at the M1 level, is underlying and connected to via 30. Vias 32, which are at via-0 level is underlying and connected to metal line 31. Gate contacts 33 and 34 further connect the respective vias 32 to gate electrodes 24A and 26A, respectively. Connection module 28 thus includes vias 30, M1 metal line 31, vias 32, and gate contacts 33 and 34. Hence, gate electrodes 24A and 26A, connected by connection module 28, are configured to have the same voltage.

Figure 5:
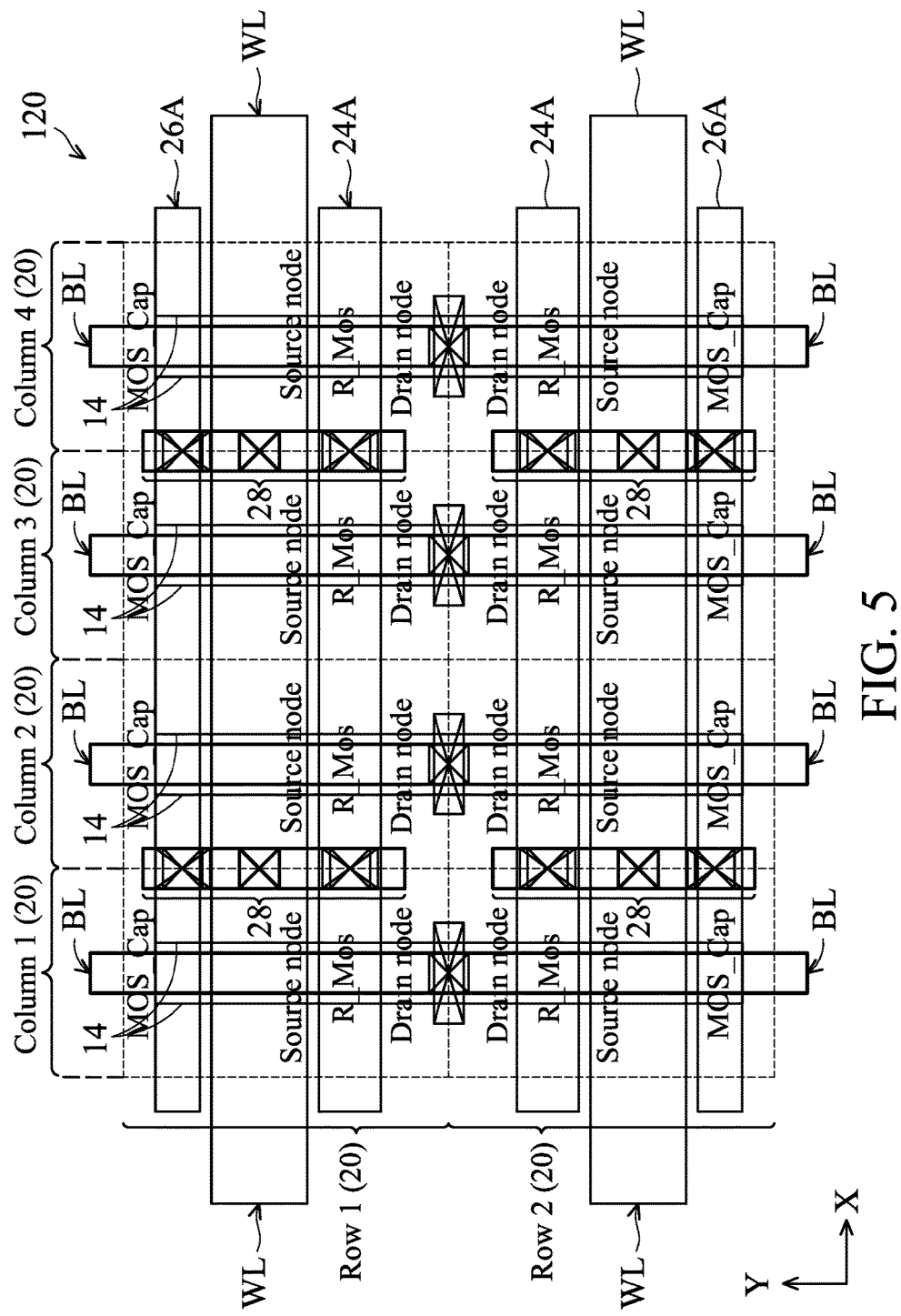
FIG. 5 illustrates the layout of an anti-fuse array in accordance with some embodiments.

FIG. 5 illustrates a layout of 2×4 anti-fuse cell array 120, which includes two rows (Row 1 and Row 2) and four columns (Column 1 through Column 4). Word lines WL, which are in the M2 level, are illustrated as continuous metal lines extending in the X direction. Bit-lines BL, which are in the M1 level, are illustrated as continuous metal lines extending in the Y direction. A plurality of connection modules 28 interconnects the gates of the MOS_Cap and the R_Mos in the same anti-fuse cell.

Figure 6:
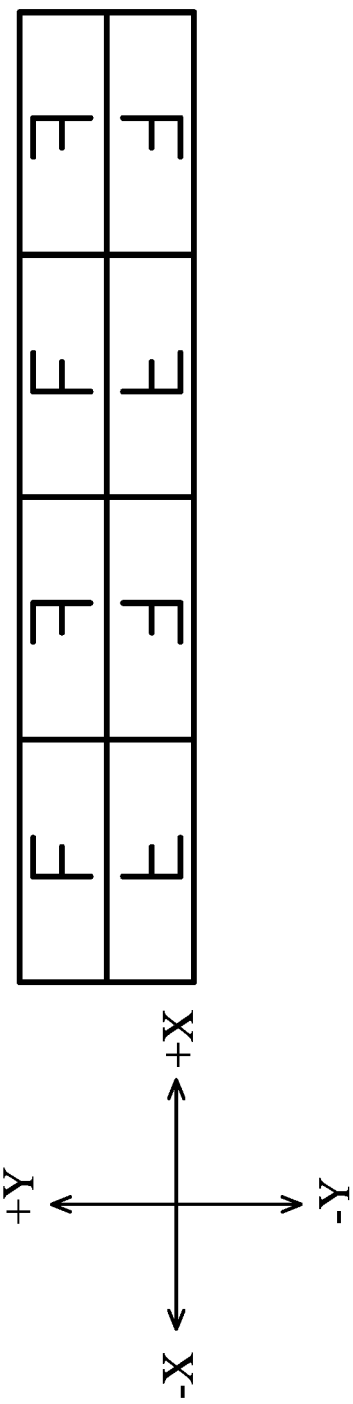
FIG. 6 illustrates a schematic view of the directions of an anti-fuse array in accordance with some embodiments.

FIG. 6 illustrates a symbolic view of the anti-fuse cell array in FIG. 5. Throughout the description of the present disclosure, in the symbolic views of anti-fuse cell arrays, letters "F" are used to illustrate the relative directions of the layouts of anti-fuse cells 20, wherein each letter "F" represents an anti-fuse cell and its orientation. Letter F is unique in that its features facing four directions (+X, −X, +Y, and −Y) are different, and hence can be used to identify the orientation of anti-fuse cells. As shown by the directions of letters F in FIG. 6, the layout of the second row of the anti-fuse cells mirrors the layout of the anti-fuse cells in the first row of the anti-fuse cell array. The layout of the second column of the anti-fuse cells mirrors the layout of the anti-fuse cells in the first column of the anti-fuse cell array. The third column and the fourth column in combination repeat the patterns of the first column and the second column in combination.

Figure 7:
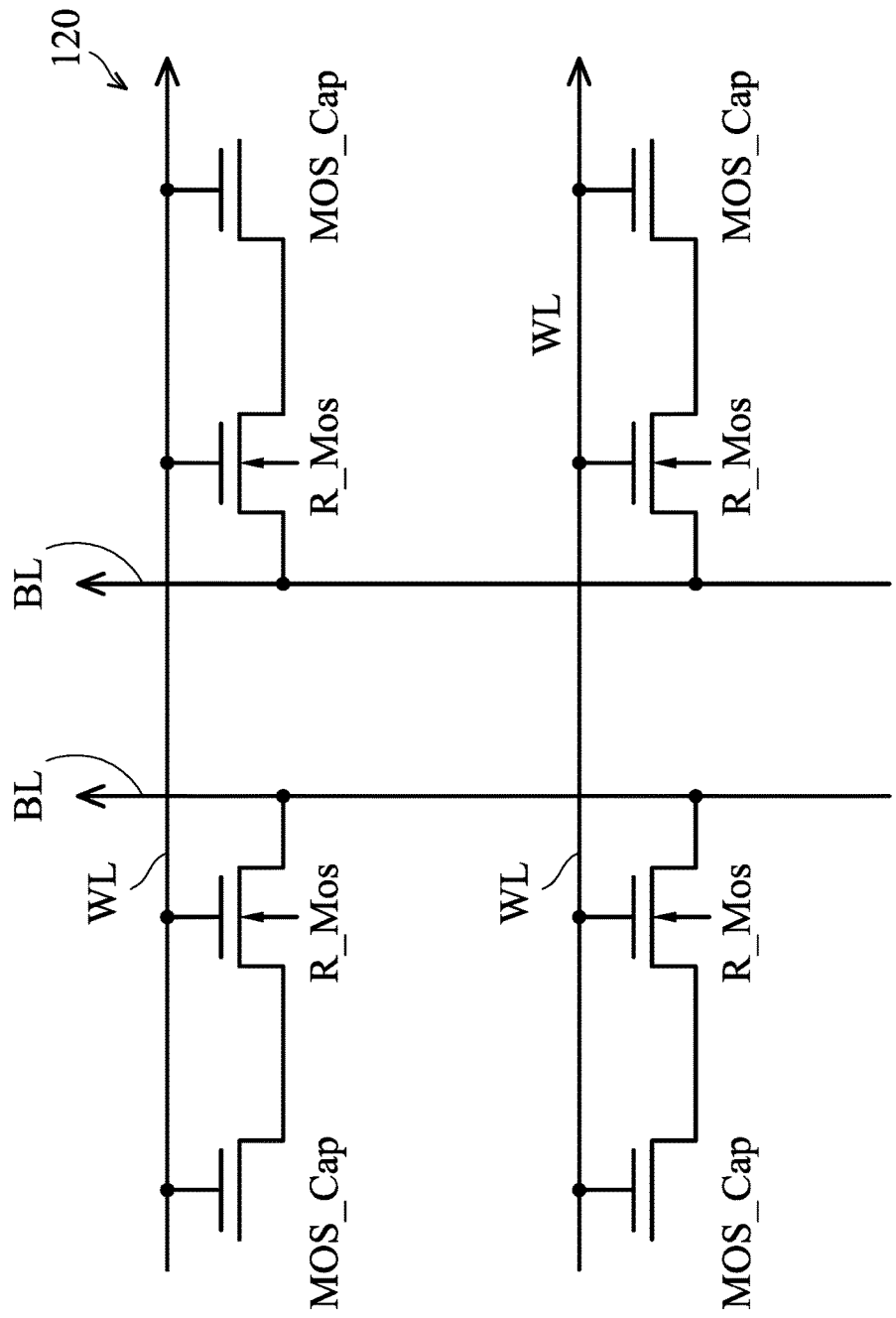
FIG. 7 illustrates a circuit schematic diagram of an anti-fuse array in accordance with some embodiments.
Figure 8:
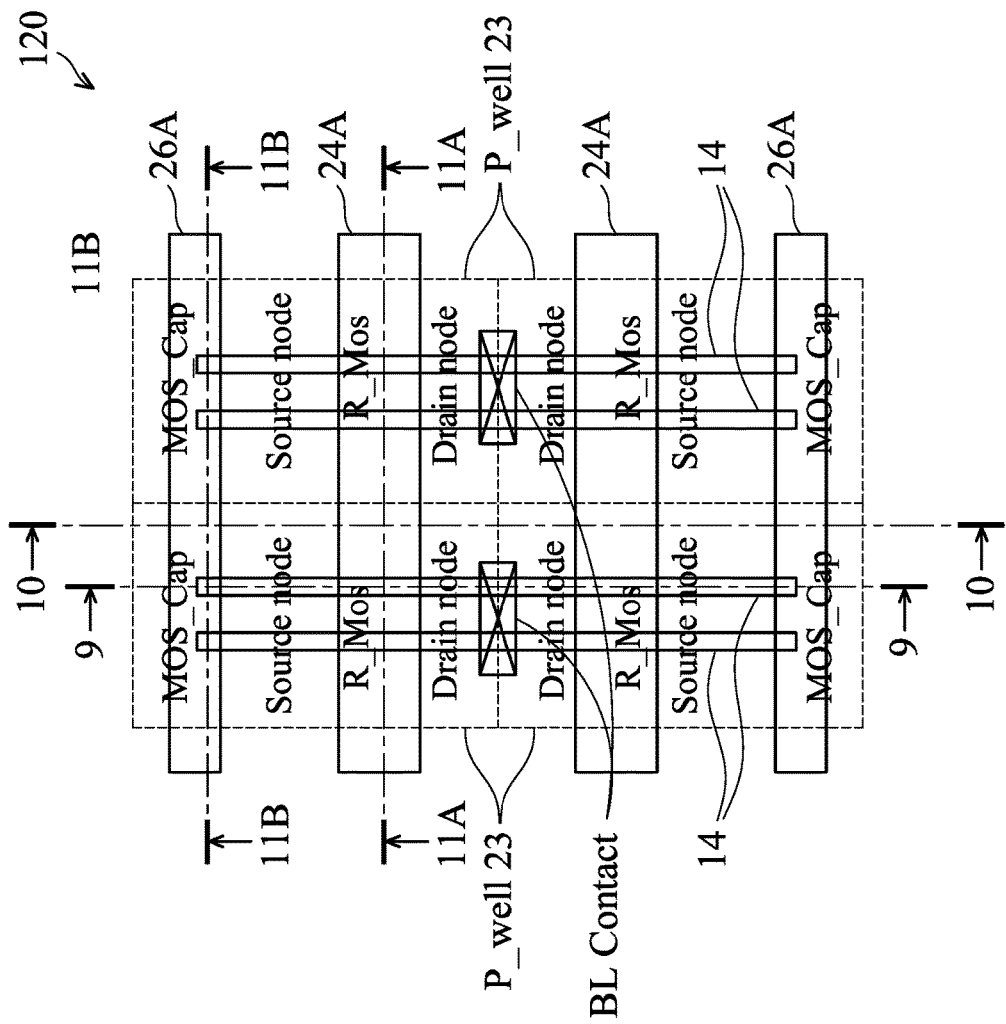
FIGS. 8 through 13B illustrate the layout and various cross-sectional views of an anti-fuse array in accordance with some embodiments.

FIGS. 7 through 11 illustrate some details of anti-fuse cells in accordance with some embodiments. FIG. 7 illustrates the circuit schematic diagram of 2×2 anti-fuse cell array 120, which is connected to two word-lines WL and two bit-lines BL. Each anti-fuse cell includes a MOS_cap and an R_Mos. FIG. 8 illustrates the layout of the 2×2 anti-fuse cell array 120 shown in FIG. 7, which illustrates P_well regions 23 extending throughout the anti-fuse cell array. The P_well regions 23 of the multiple anti-fuse cells are further connected to form a contiguous P-well region.

A plurality of cross-sectional views are taken from FIG. 8, wherein the cross-sectional views are illustrated in FIGS. 9, 10, 11A, and 11B. FIG. 9 illustrates the cross-sectional view obtained from the plane containing line 9-9 in FIG. 8. Semiconductor fin (active region) 14 is higher than the top surfaces of STI regions 22. Source and drain regions 26C, 24C, and 24B may be formed in P-well 23 as re-grown epitaxy regions, and hence are marked as S/D epi. The end 14' of fin 14 extends underlying gate electrode 26A, and a first portion of gate electrode 26A is directly overlying fin 14, and a second portion of gate electrode 26A is misaligned with gate electrode 26A. One side of the MOS_Cap is STI region 22, and hence MOS_Cap is a partial transistor having no second source/drain region. An advantageous feature of the capacitor formed of the partial transistor is that when gate dielectric 26D is broken down, the broken-down location will face source/drain node 26C/24C. As a comparison, if the MOS_Cap also has a second source/drain region, the broken down region has the possibility of breaking down on the second source/drain side. This means that the resistance of the equivalent transistor 27 (refer to FIG. 3C) between gate electrode 26A and the respective source/drain node 26C will be high because the resistance includes the resistance of a portion of the channel between the breaking point and source/drain region 26C. Accordingly, by using the partial transistor to form the programming capacitor MOS_Cap, the resistance of the resulting programmed MOS_Cap is advantageously reduced.

Gate electrodes 24A and 26A may be formed of metal, metal alloy, metal silicide, metal nitride, or the like. Gate dielectrics 24D and 26D may be formed of a high-k dielectric having a k value higher than 3.8. The k value may be higher than about 7.0. The high-k dielectric material may include aluminum oxide, hafnium oxide, lanthanum oxide, or the like. Gate dielectric 26D of the MOS_Cap has thickness T1. Gate dielectric 24D of the MOS_Cap has thickness T2, which is greater than thickness T1. The ratio T2/T1 is selected to be high enough so that in the programming of the MOS_Cap, gate dielectric 26D is broken down, while gate dielectric 24D remains not broken down. In accordance with some embodiments, the ratio T2/T1 is greater than about 1.5, and may be greater than about 2.0. Ratio T2/T1 may be between about 1.5 and about 2.5. This ratio range ensures that when gate dielectric 26D is broken down, gate dielectric 24D remains not broken down with adequate but not excess margin. In accordance with some embodiments of the present disclosure, gate dielectric 26D is formed simultaneously as, and hence having the same thickness as, core transistors (not shown) in the same chip, and gate dielectric 24D is formed simultaneously as, and hence having the same thickness as, Input/output (IO) transistors (not shown) in the same chip.

It is further observed that the MOS_Cap and the R_Mos are formed in a same P_well 23, which also extends throughout the anti-fuse cell array 120, as shown in FIG. 7. The source/drain nodes may be formed of epitaxy regions in the recesses in the P_well 23, and are doped with n-type impurities. The formation of P_well 23 reduces source/drain leakage currents.

Figure 10:
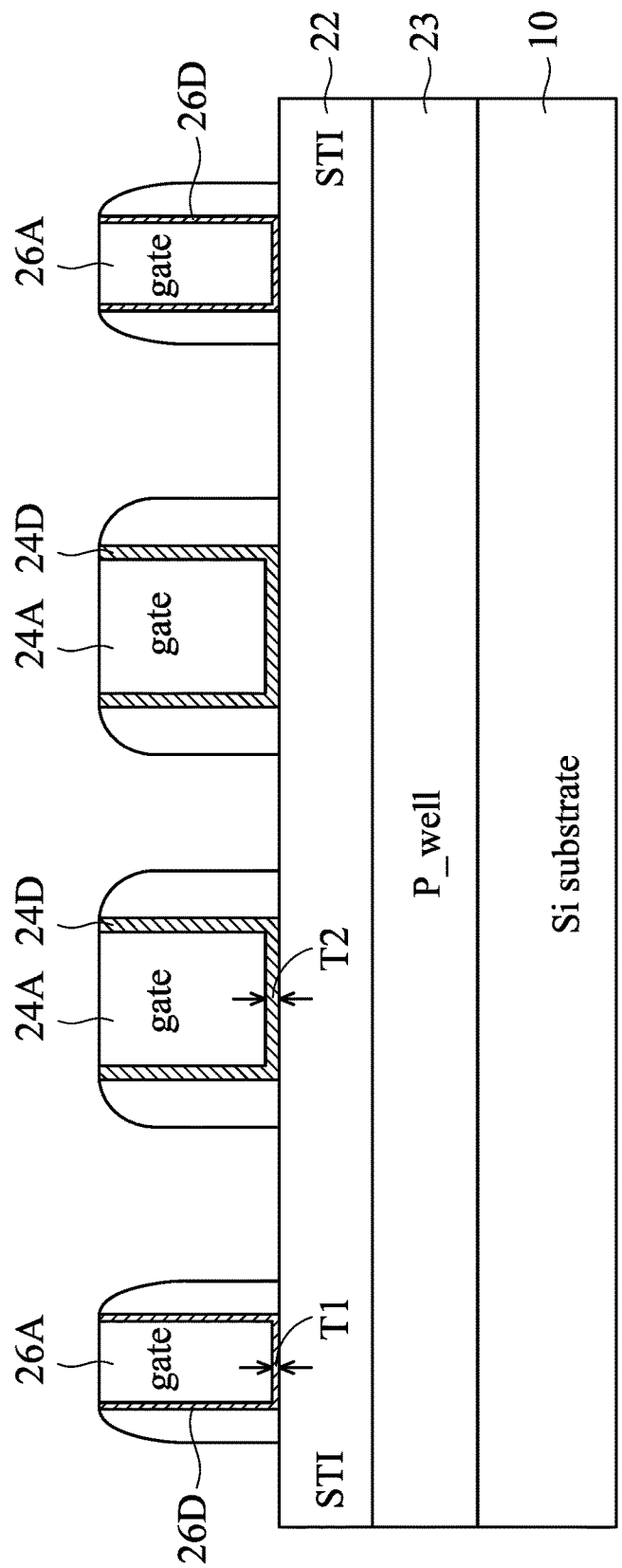

FIG. 10 illustrates a cross-sectional view obtained from the plane containing line 10-10 in FIG. 8. The illustrated portion crosses STI region 22. Again, FIG. 10 illustrates different thicknesses T1 and T2.

Figure 11B:
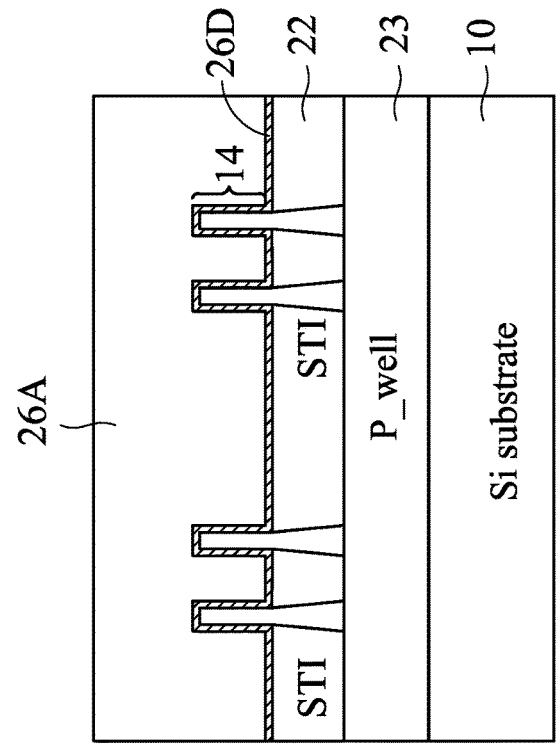
Figure 11A:
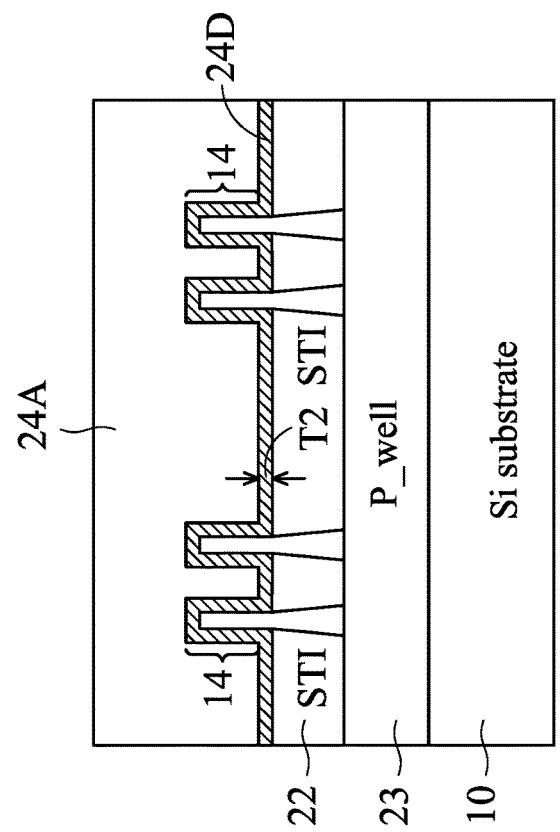

FIG. 11A illustrates a cross-sectional view obtained from the plane containing line 11A-11A in FIG. 8. The cross-sectional view crosses gate electrode 24A of the R_Mos. FIG. 11B illustrates a cross-sectional view obtained from the plane containing line 11B-11B in FIG. 8. The cross-sectional view crosses gate electrode 26A of the MOS_Cap. Semiconductor fins 14, which are between opposite portions of the recessed STI regions 22, are also illustrated.

Figure 12:
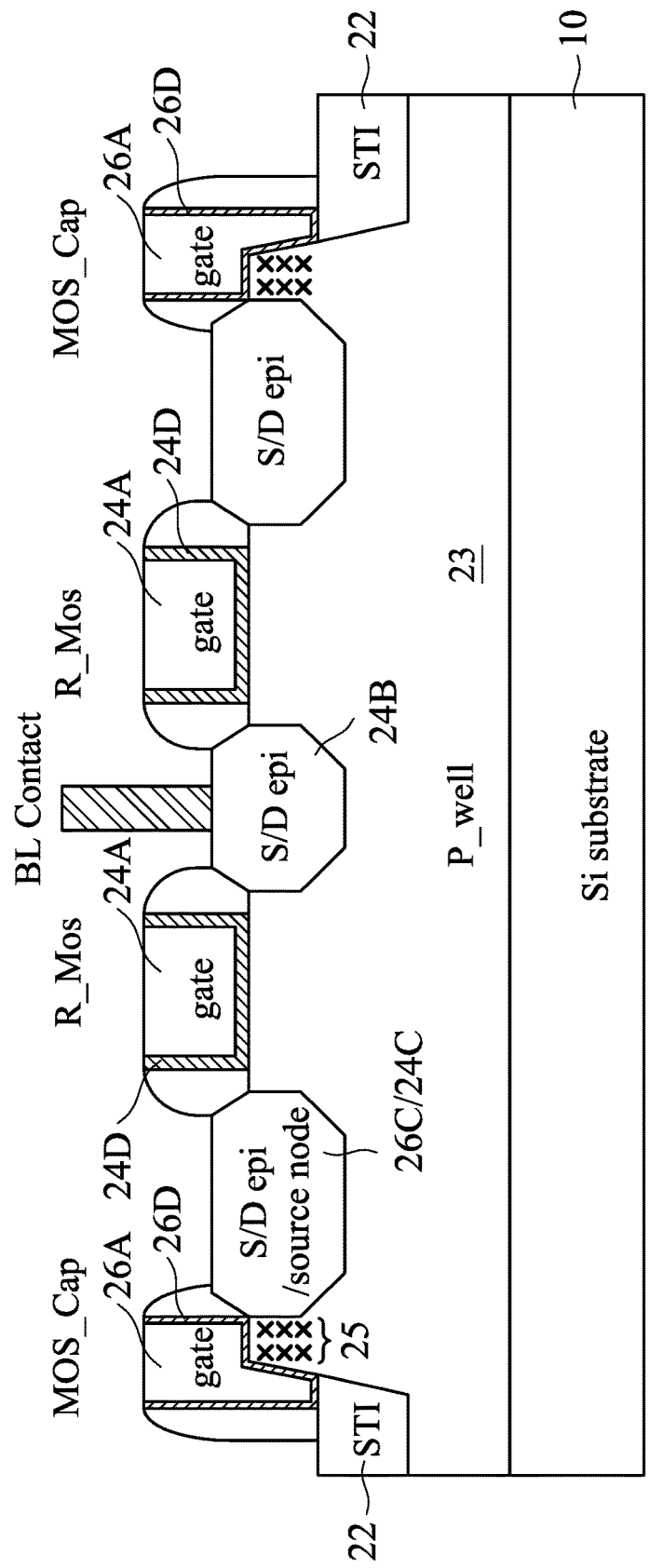

Referring back to FIG. 9, in accordance with some embodiments of the present disclosure, the channel region 25 directly under gate electrode 26A is of p-type since it is a part of the P_well 23. It is noted that region 25 is named as a "channel" to indicate it is directly underlying the respective gate, while it is not a channel for interconnecting source and drain regions. FIG. 12 illustrates the cross-sectional view in accordance with alternative embodiments, wherein the channel region 25 is also doped to n-type, which is of the same conductivity type as the connecting source/drain region 26C/24C. Accordingly, no p-n junction exists between channel 25 and source/drain node 26C/24C. The doped n-type dopants are illustrated using "x" symbols. The dopants may include arsenic, phosphorous, or the like. Also, the n-type impurity concentration in channel 25 may be high, for example, in the range between about $1E19/cm^3$ and about $1E21/cm^3$. Advantageously, with no P-N junction between channel region 25 and source/drain node 26C/24C, and/or further because the dopant concentration of channel region 25 may be increased, the resistance of resistor 27 (refer to FIG. 2C) is advantageously reduced.

Figure 13A:
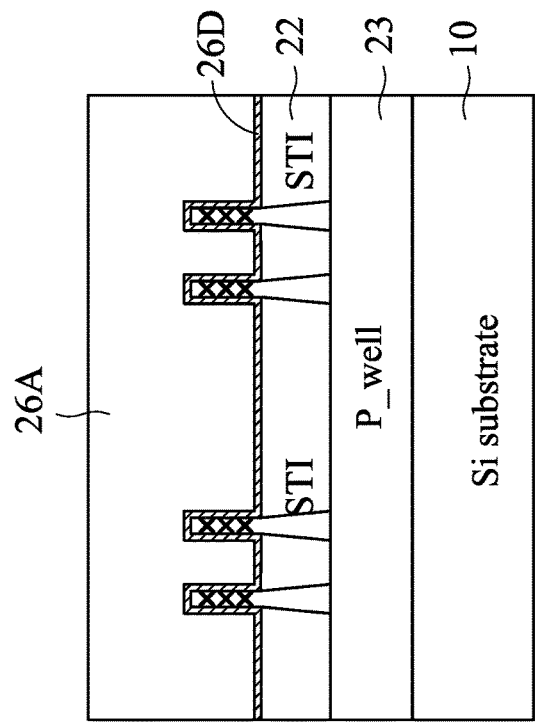
Figure 13B:
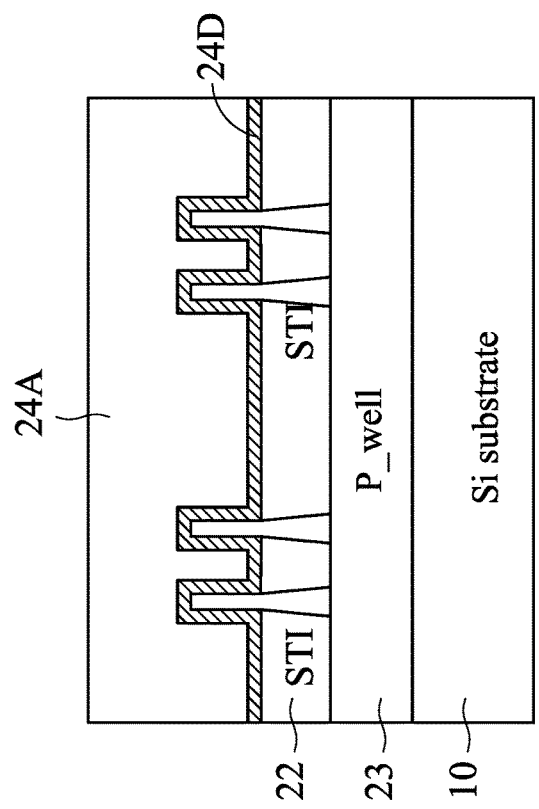

FIGS. 13A and 13B illustrate the cross-sectional views of the anti-fuse cell array when channel region 25 is doped with n-type. FIG. 13A also illustrates a cross-sectional view obtained from the plane containing line 11A-11A in FIG. 8. The cross-sectional view crosses gate electrode 24A of the R_Mos. The structure shown in FIG. 13A is essentially the same as that shown in FIG. 11A since the doped channel region 25 is not in the illustrated plane.

FIG. 13B also illustrates a cross-sectional view obtained from the plane containing line 11B-11B in FIG. 8. The cross-sectional view crosses through gate electrode 26A of the MOS_Cap. The illustrated portions of semiconductor fins 14 are doped with n-type impurities, as illustrated by the "x" symbols.

Figure 14:
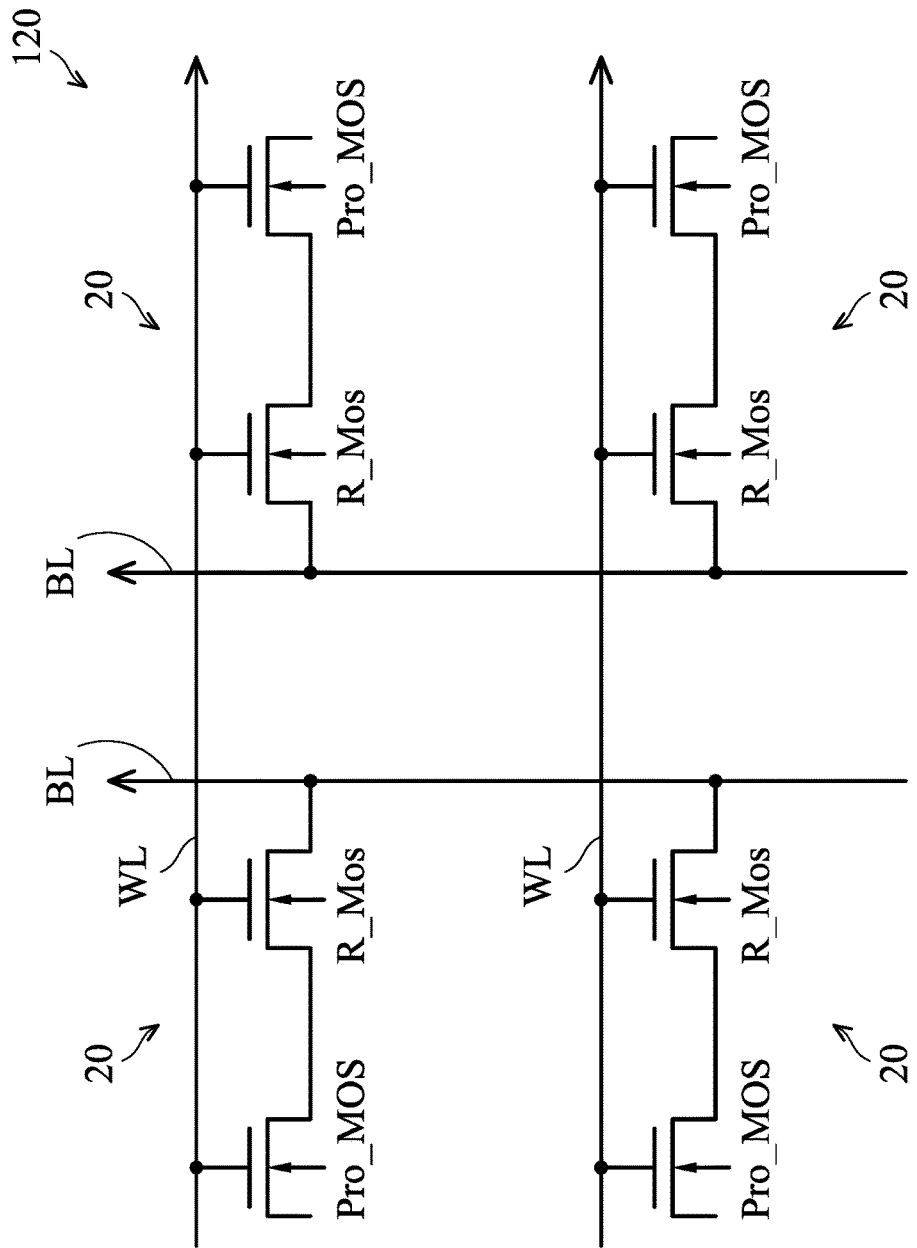
FIG. 14 illustrates a circuit schematic diagram of an anti-fuse array in accordance with some embodiments.
Figure 15:
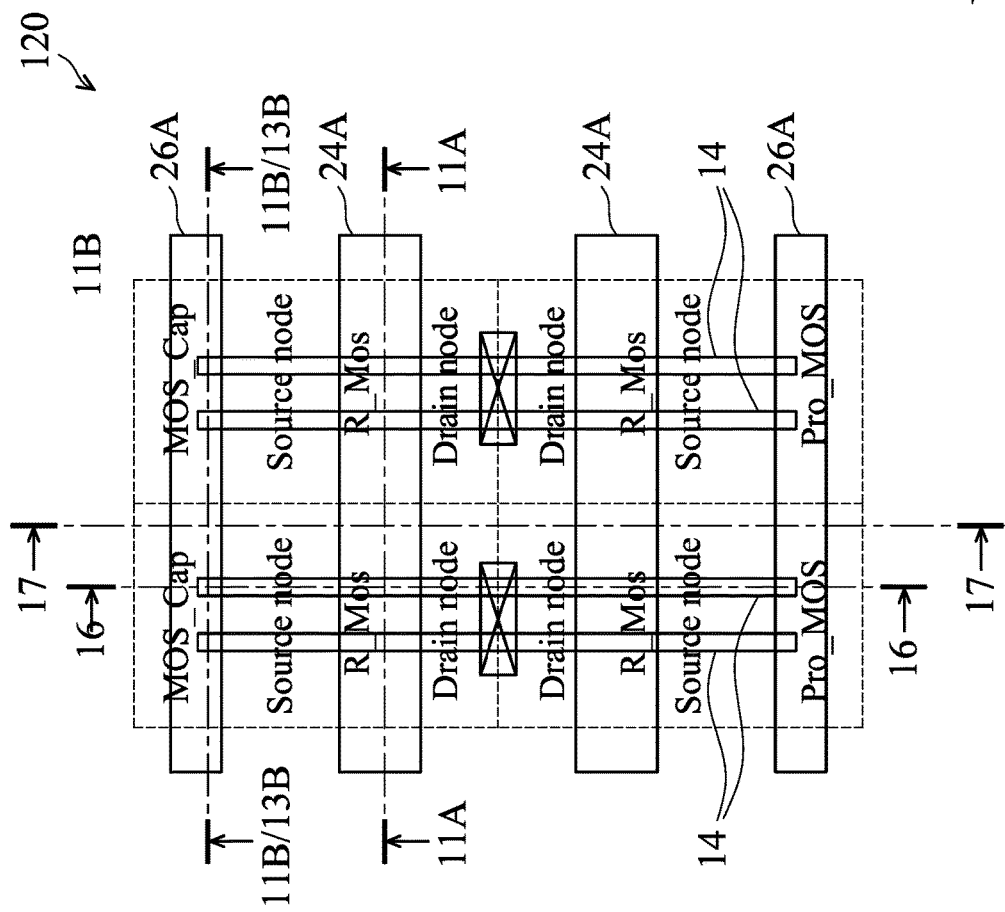
FIGS. 15 through 17 illustrate the layout and various cross-sectional views of an anti-fuse array in accordance with some embodiments.

FIGS. 14 through 17 illustrate anti-fuse cells 20 in accordance with some embodiments. These embodiments are similar to the embodiments in FIG. 7 through 13B, except that the partial MOS devices in FIG. 7 through 13B are replaced by the Pro_MOS devices as shown in FIGS. 3A through 3C, resulting in the structure shown in FIGS. 14 through 17. FIG. 14 illustrates the circuit schematic diagram of 2×2 anti-fuse cell array 120, wherein cells 20 are connected to two word-lines WL and two bit-lines BL. Each anti-fuse cell 20 includes a Pro_MOS and a R_Mos. FIG. 15 illustrates the layout of the 2×2 anti-fuse cell array 120 shown in FIG. 14. As shown in FIG. 14, semiconductor fins 14 extend onto the opposite sides of gate electrodes 26A.

Figure 16:
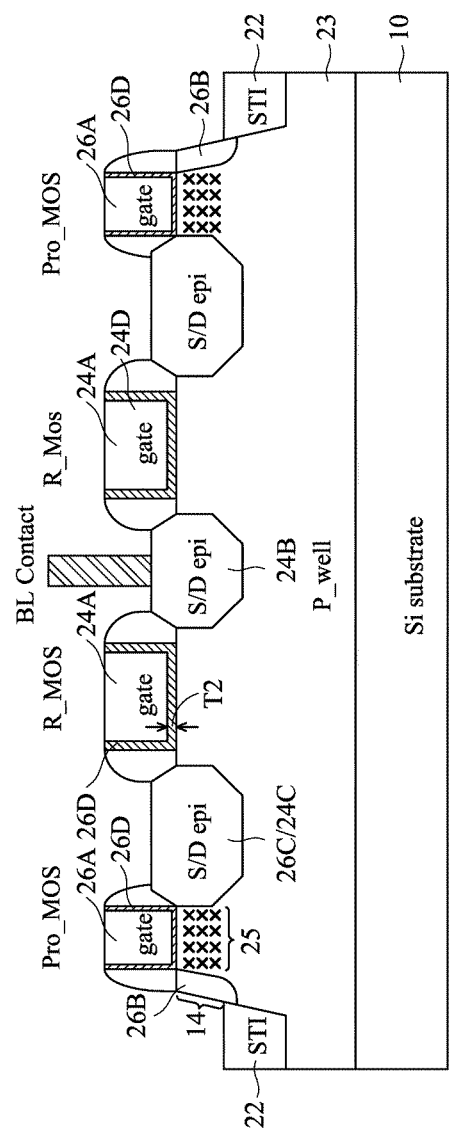
Figure 17:
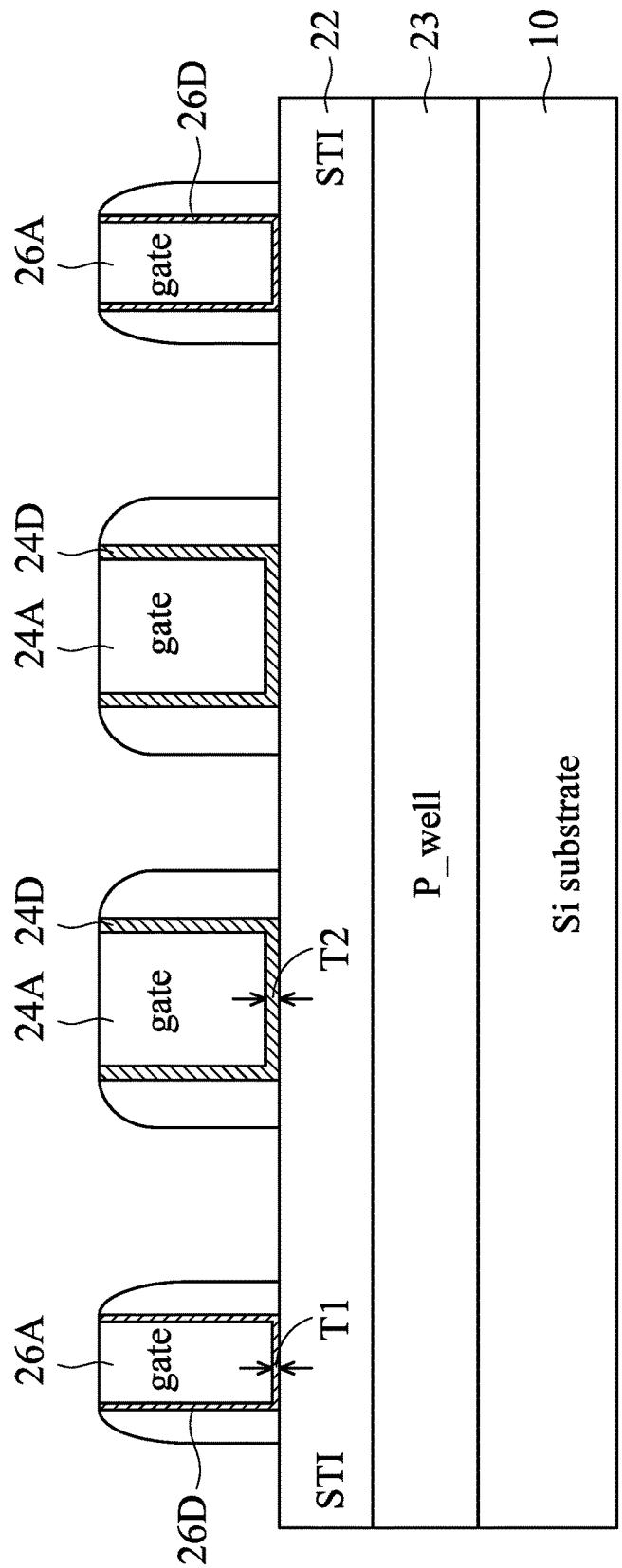

Cross-sectional views are taken from FIG. 15, as shown in FIGS. 16 and 17. FIG. 16 illustrates a cross-sectional view obtained from the plane containing line 16-16 in FIG. 15. Semiconductor fin (active region) 14 is higher than the top surfaces of STI regions 22. The R_Mos devices share common drain region 24B, which is of p-type, and is connected to the BL contact. In accordance with some embodiments, as shown in FIG. 16, channel region 25 is doped to n-type, and hence source/drain region 26B, channel region 25, and source/drain region 26C/24C of the Pro_MOS device in combination form a continuous n-type region. In accordance with alternative embodiments, no n-type channel doping is performed, and hence the p-type channel region 25 separates n-type source/drain region 26B from n-type source/drain region 26C/24C. Again, the Pro_MOS devices and the R_Mos are formed on the same P_well region 23.

FIG. 17 illustrates a cross-sectional view obtained from the plane containing line 17-17 in FIG. 15. The illustrated portion crosses STI region 22, and hence source/drain regions are not shown. Again, FIG. 17 illustrates different thicknesses T1 and T2.

The cross-sectional view obtained from the plane containing line 11A-11A in FIG. 15 is essentially the same as what is shown in FIG. 11A. The cross-sectional view obtained from the plane containing line 11B/13B-11B/13B in FIG. 15 is essentially the same as that is shown in FIG. 11B or FIG. 13B, depending on whether n-type channel doping is performed or not. The details are thus not repeated herein.

FIGS. 18 through 21 illustrate the layouts of 2×2 anti-fuse cell arrays 120 in accordance with some embodiments of the present disclosure. The circuit schematic diagram of anti-fuse cell arrays 120 is the same as shown in FIG. 7. In accordance with some embodiments, throughout the embodiments shown in FIGS. 18 through 21, active regions 14 are active region blocks (rather than fins), and hence the resulting R_Mos and MOS_Cap (or Pro_MOS) devices are planar devices. In accordance with other embodiments, active regions 14 are semiconductor fins, wherein the resulting R_Mos and MOS_Cap (or Pro_MOS) devices are fin devices.

Figure 18:
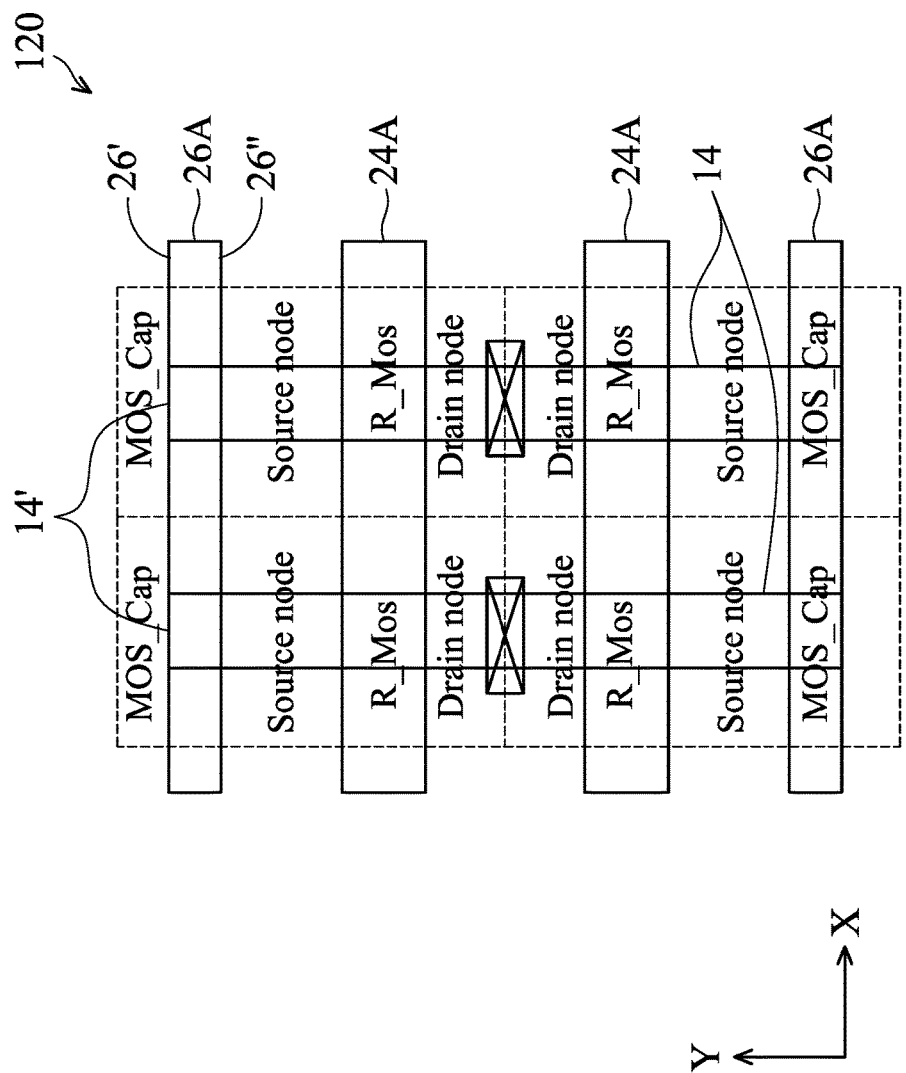
FIGS. 18 through 24 illustrate the layouts and the schematic views of the directions of anti-fuse arrays in accordance with some embodiments.

Referring to FIG. 18, active regions 14 have gate electrodes 24A and 26A over them. The ends 14' of active regions are aligned with edge 26' of gate electrode 26A. Accordingly, the resulting MOS_Cap is a partial MOS that does not include the drain region.

Figure 19B:
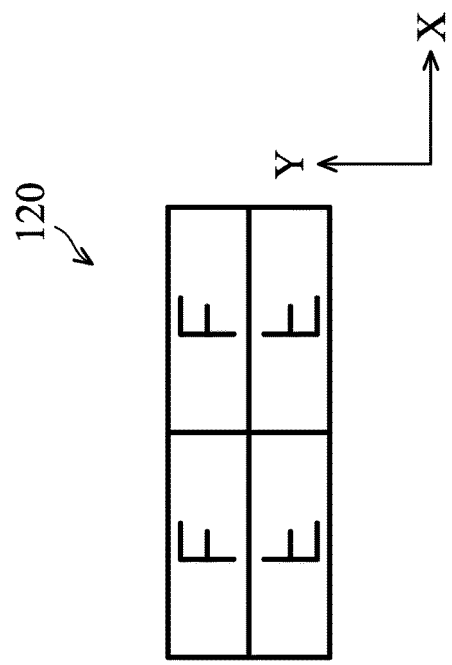
Figure 19A:
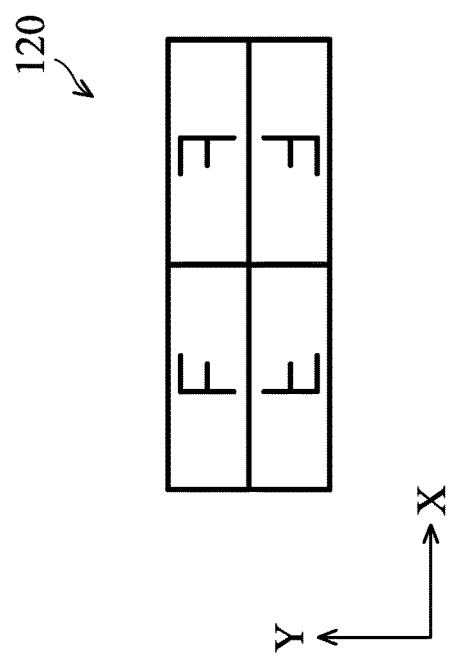

FIGS. 19A and 19B illustrate the mirroring of anti-fuse cells. The second row is flipped relative to the first row, wherein the flipping is relative to a line extending in the X direction. Accordingly, the second row mirrors the first row. The second column is also flipped (relative to a horizontal line) relative to the first column, wherein the flipping is relative to a line extending in the Y direction. Accordingly, the second column mirrors the first column. In FIG. 19B, the second row mirrors the first row, while the second column is a repetition (not mirrored) of the first column. Referring back to FIG. 18, it is observed that an anti-fuse cell may be symmetric (or non-symmetric) to its middle line that extends in the Y direction. In which case, mirroring or not mirroring columns may result in the same structure.

Figure 20:
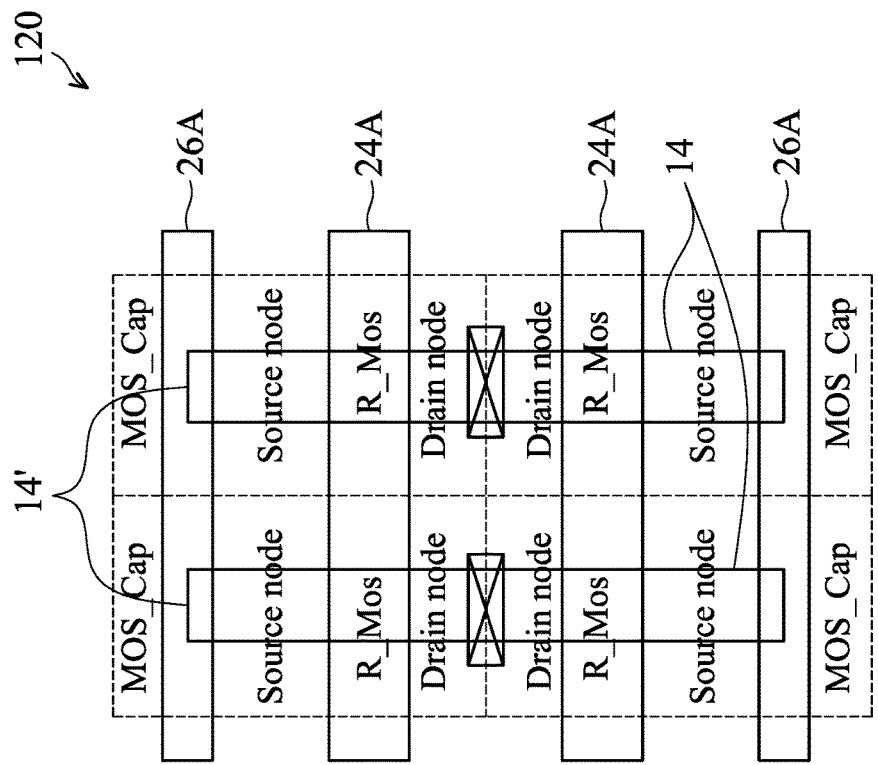
Figure 21A:
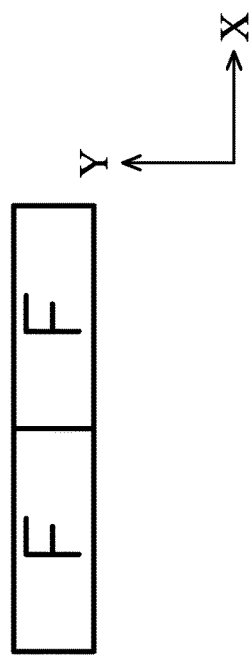
Figure 21B:
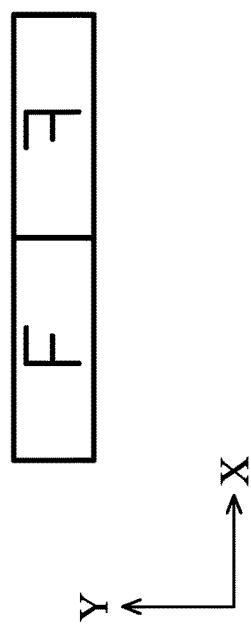

FIG. 20 illustrates the layout of 2×2 anti-fuse cell array 120 in accordance with some embodiments. This layout is similar to the layout shown in FIG. 7, except in FIG. 20, active region 14 is a bulk active region, and hence the resulting R_Mos and MOS_cap are planar devices. FIG. 21A illustrates that the second column mirrors the first column. FIG. 21B illustrates that the second column is a repetition of the first column.

Figure 22:
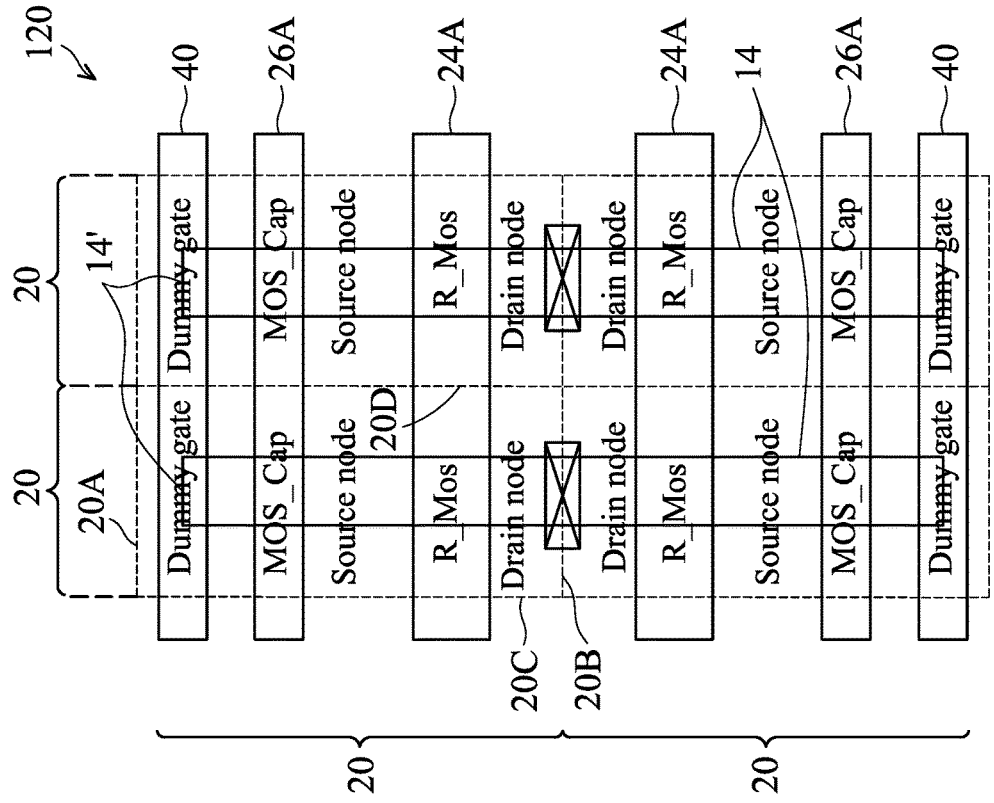
Figure 23:
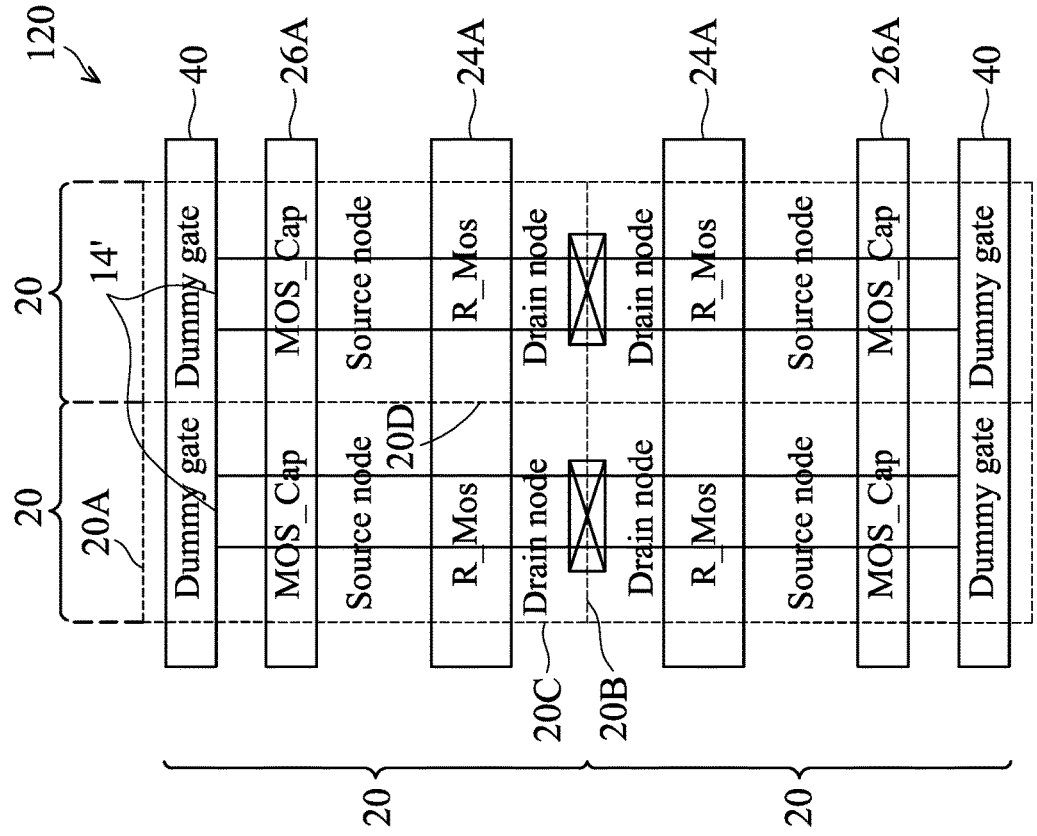

FIGS. 22 and 23 illustrate the layouts of 2×2 anti-fuse cell arrays 120, wherein dummy gate electrodes 40 are added. Dummy gate electrodes 40 may be electrically floating. In FIG. 22, dummy gate electrodes 40 are within the respective rows of anti-fuse cells, and do not extend into two rows of anti-fuse cells 20. Dummy gate electrodes 40 extend to boundaries 20C and 20D of the same anti-fuse cell 20. In accordance with some embodiments of the present disclosure, active regions 14 extend underlying, and do not cross, dummy gate electrodes 40. Accordingly, ends 14' of active regions 14 are overlapped by dummy gate electrodes 40.

Figure 24:
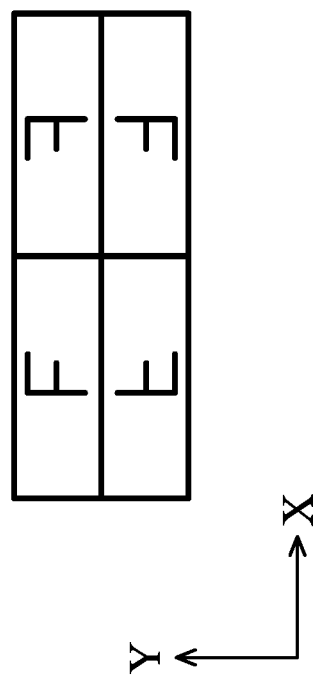

FIG. 23 illustrates the layout of 2×2 anti-fuse cell array 120 in accordance with some embodiments. One of dummy gate electrodes 40 overlaps boundary 20A, while no dummy gate electrode overlaps boundary 20B, wherein the lengthwise directions of dummy gate electrodes 40 are parallel to the lengthwise direction of boundary 20A. FIG. 24 illustrates a symbolic view of a 2×2 anti-fuse cell array, which illustrates that the first row and the second row are flipped relative to each other along a line extending in the X direction, and the first and the second columns are flipped relative to each other along a line extending in the Y direction. Accordingly, the first row and the second row mirror each other, and the first column and the second column mirror each other.

Figure 25:
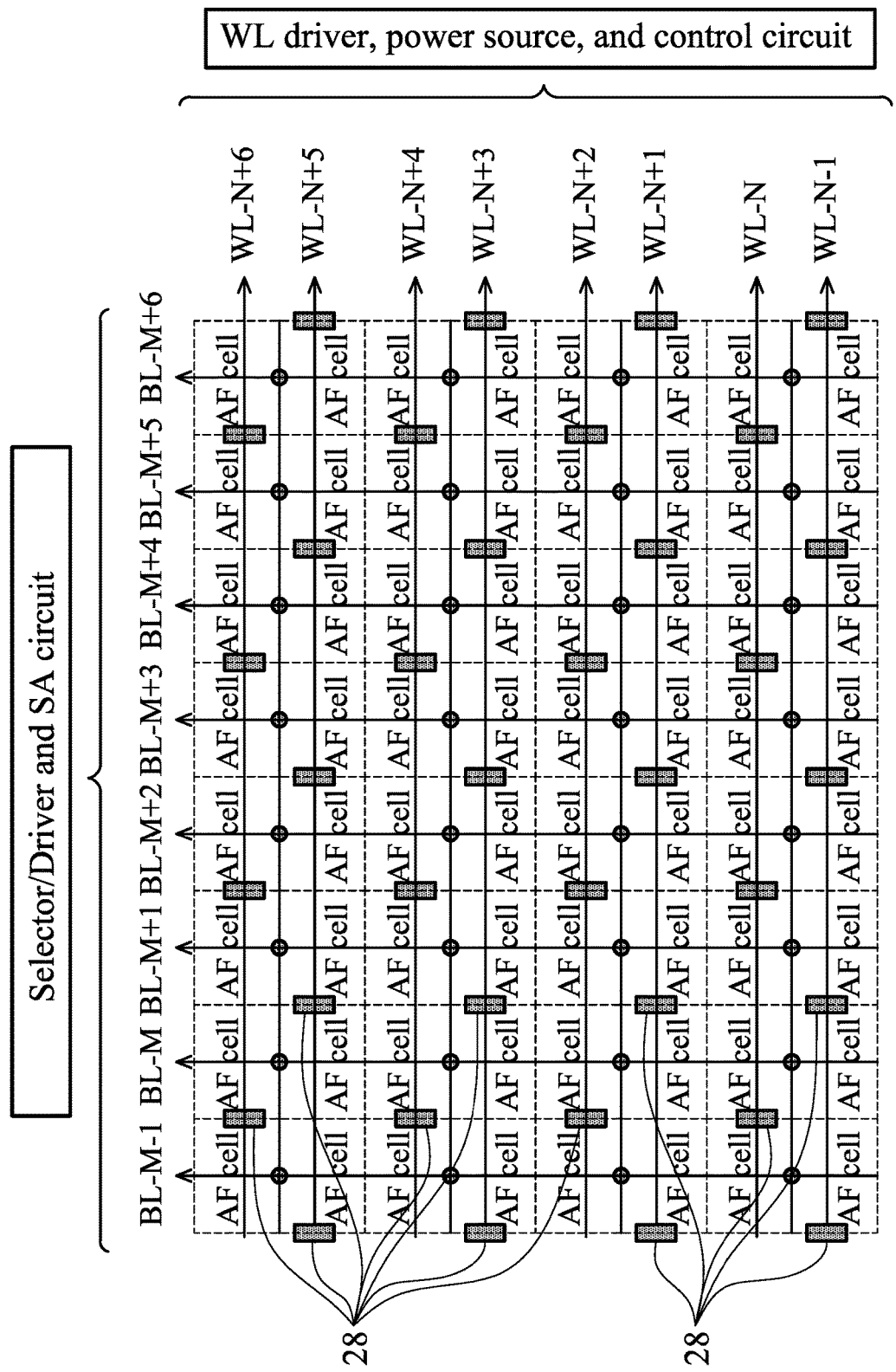
FIGS. 25 and 26 illustrate the connection modules in anti-fuse arrays in accordance with some embodiments.
Figure 26:
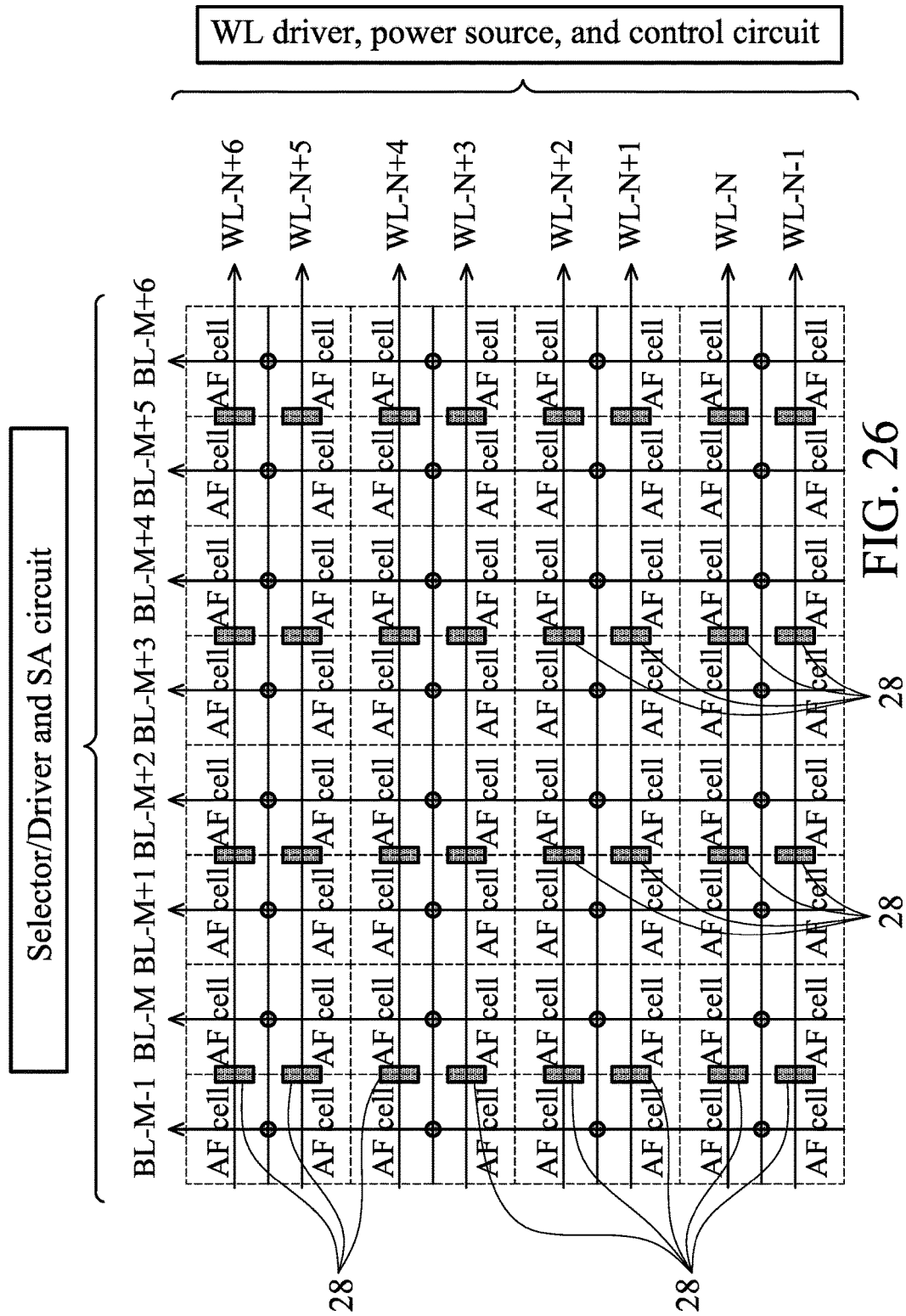

FIG. 25 illustrates the strapping of word-lines WL-N−1 through WL-N+6. The rectangles crossing the word-lines represent connection modules 28. In FIG. 25, in each of the rows, every two adjacent anti-fuse (AF) cells (in different columns) share one connection module 28. The connection modules 28 in neighboring rows are misaligned. In FIG. 26, in each of the rows, every two adjacent anti-fuse cells share one connection module 28, and the connection modules 28 in neighboring rows are aligned.

Figure 27:
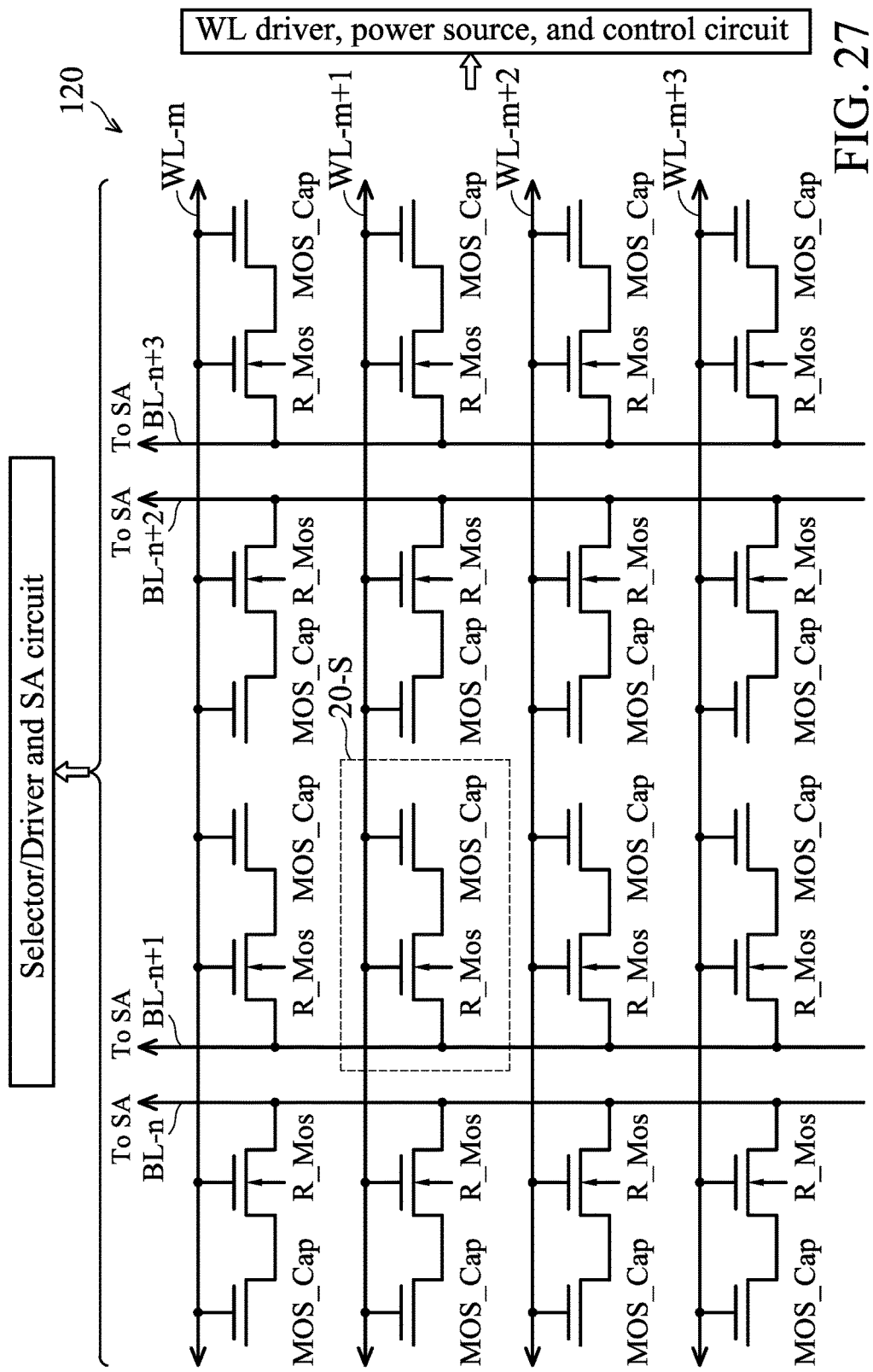
FIGS. 27 through 30 illustrate the programming and reading schemes of an anti-fuse array in accordance with some embodiments.
Figure 28:
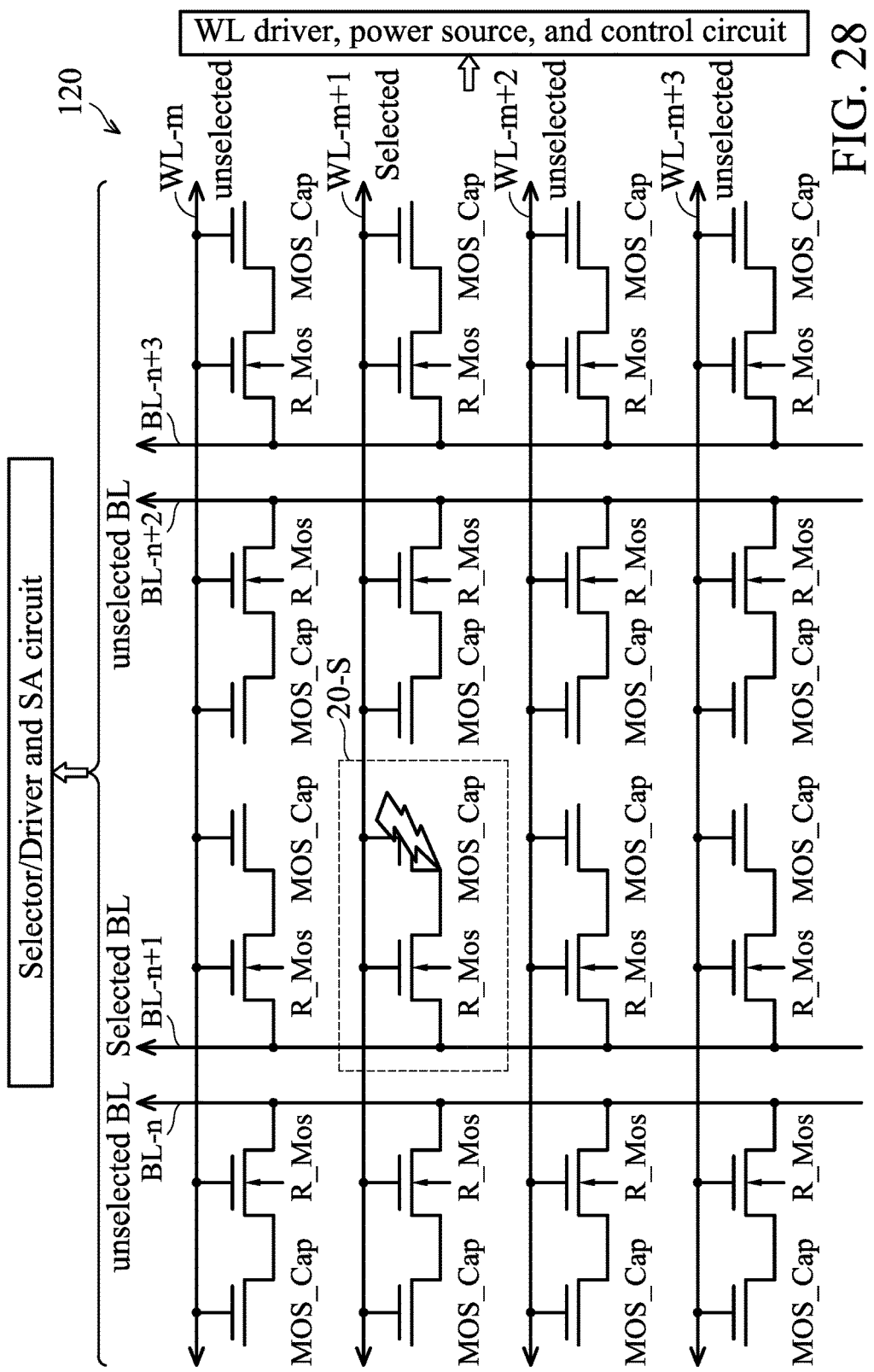

FIGS. 27 through 30 illustrate the program operation and read operation of anti-fuse cell array 120 in accordance with some embodiments, wherein a 4×4 anti-fuse cell array 120 is used as an example. The anti-fuse cells (each including an R_MOs and a MOS_Cap) are connected to word-lines WL-m, WL-m+1, WL-m+2, and WL-m+3. The anti-fuse cells are also connected to bit-lines BL-n, BL-n+1, BL-n+2, and BL-n+3. Word-lines WL-m, WL-m+1, WL-m+2, and WL-m+3 are further connected to a word-line driver, a power source for providing word-line voltages, and a control circuit. Bit-lines BL-n, BL-n+1, BL-n+2, and BL-n+3 are further connected to a sensing amplifier(s) (SA), selector/driver circuit, and a power source for providing bit-line voltages. FIG. 27 illustrates the anti-fuse cell array 120 before any programming is performed. Accordingly, the gate dielectrics of all MOS_Cap devices are not broken down, FIG. 28 illustrates the programming of a selected cell. In the illustrated example, the cell connected to word-line WL-m+1 and bit-line BL-n+1 is a selected cell that is to be programmed. The remaining cells are un-selected cells that will not be programmed. The selected cell is marked as 20-S.

Table 1 illustrates an example of the voltages applied to the selected and unselected word-lines, and the voltages applied to the selected and unselected bit-lines during program and read operations. It is appreciated that the voltages provided in Table 1 are examples, and different voltage may be used.

TABLE 1

|  | WL (Selected) | WL (unselected) | BL (Selected) | BL (unselected) |
| --- | --- | --- | --- | --- |
| Program voltage | 3 V~5 V | 0 V | 0 V | 1.5 V~2.5 V |
| Read voltage | 0.8 V~1.8 V | 0 V | Pre-charged voltage such as 0 V, connected to SA | 0 V, floating, or predetermined voltage |

As shown in Table 1, in a program operation, the selected word-line is applied with a voltage between about 3V and about 5V, the unselected word line is applied with a voltage of 0V. The voltage of 3V~5V is high enough to break down the gate dielectric of the MOS_Cap in the selected cell, but not high enough to break down (damage) the gate dielectric of the R_MOS in the selected cell. The selected bit-line is applied with a voltage of 0V, and the unselected bit-line is applied with a voltage equal to about a half (about 1.5V to about 2.5V) of the voltage applied on the selected word-line. In a read operation, the selected word-line is applied with a voltage between about 0.8V and about 1.8V, the unselected word line is applied with a voltage of 0V. The selected bit-line is pre-charged to a selected voltage (such as 0V), and the unselected bit-line is applied with a voltage of 0V or another predetermined voltage, or kept floating. The voltage of about 0.8V~1.8V is low enough not to break any gate dielectric in the respective anti-fuse cell. The voltages in Table 1 are provided by a power source(s) (not shown) connected to the word-lines and bit-lines.

In a program operation, as shown in FIG. 28, the selected word-line WL-m+1 is applied with a voltage of 3V~5V, which is applied to both gate electrodes of R_MOS and MOS_Cap in the selected cell 20-S. The selected bit-line BL-n+1 is applied with a voltage of 0V. The R_MOS in the selected cell 20-S is fully turned on, and hence the voltage of 3V~5V is applied on the gate dielectric of the MOS_Cap in the selected cell 20-S, causing the breakdown of the gate dielectric (of the MOS_Cap), which is the thin gate dielectric as shown in FIGS. 9 and 12. On the other hand, although the high voltage is also applied on the R_MOS, since the gate dielectric of the R_MOS is thick, no breakdown or damage occurs. The resulting MOS_Cap is illustrated as transistor 27 in FIG. 29.

Referring again to FIG. 28, in the selected row that is connected to selected word-line WL-m+1, since the unselected bit-lines are applied with the voltage of 1.5V and 2.5V, the R_MOS devices in the selected row and unselected columns are fully turned on also, and the respective bit-line voltages (1.5V~2.5V) are also applied to the respective MOS_Cap devices. As a result, the voltages between the gates and the respective source/drains of the MOS_Cap devices in the selected row and unselected columns are ((3V~5V)−(1.5V~2.5V)), which is also about 1.5V~2.5V. This voltage is not high enough to cause the breakdown of the MOS_Cap and the R_MOS devices, and no programming occurs.

For similar reasons, the cells in remaining anti-fuse cells are not applied with voltage that is high enough to cause breakdown, and hence no breakdown occurs.

Figure 29:
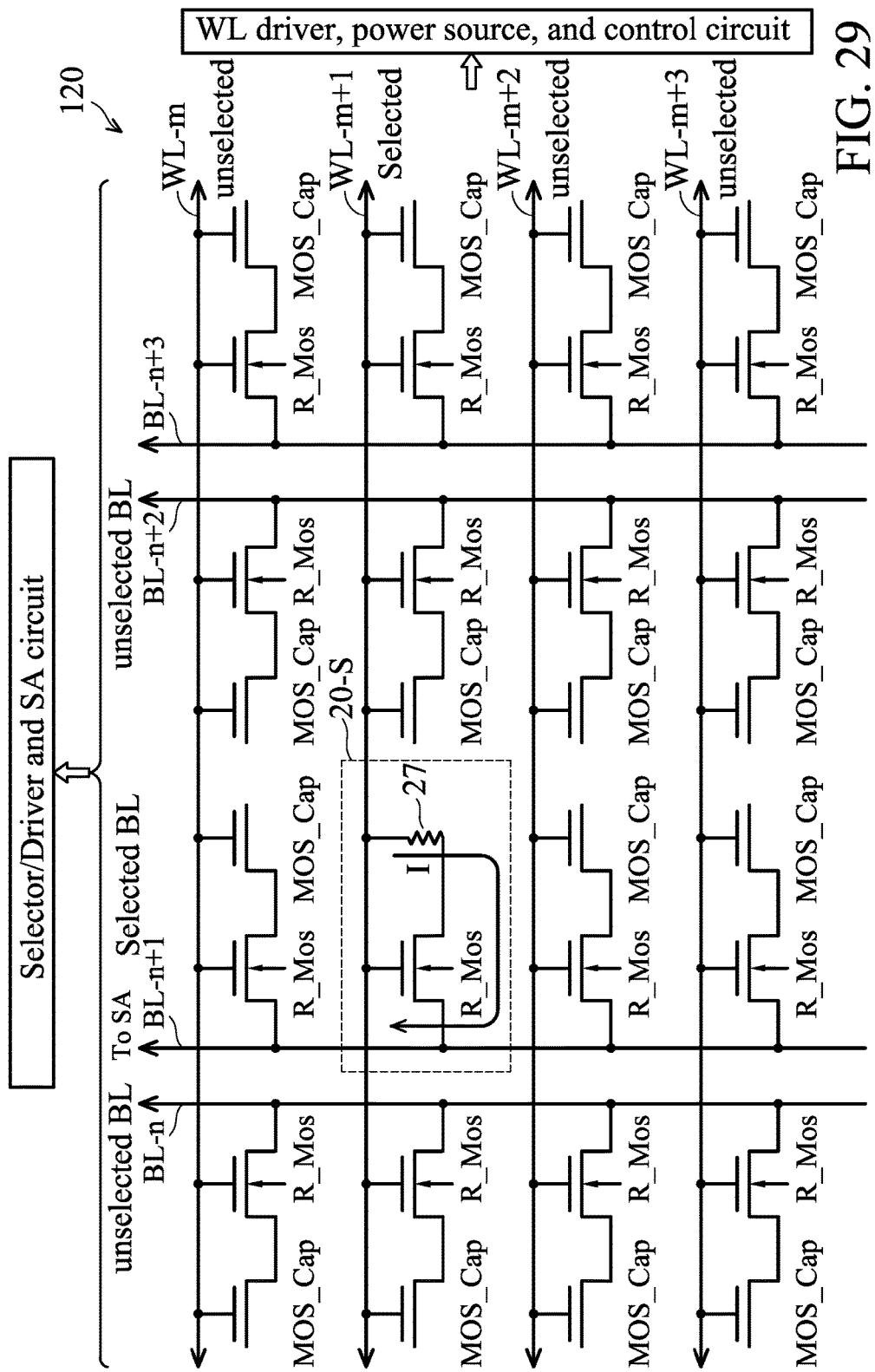

FIG. 29 illustrates the read operation of the programmed cell 20-S, which is connected to word-line WL-m+1 and bit-line BL-n+1. The selected word-line WL-m+1 is applied with a voltage of 0.8V~1.8V, and the selected bit-line BL-n+1 may be pre-charged to 0V. Accordingly, the R_MOS device in the selected cell 20-S is fully turned on, and the word-line WL-m+1 charges bit-line BL-n+1 (with charging current I). The voltage on bit-line BL-n+1 increases in response to the charging, and may increase to about 0.6V~1.6V, for example. The sensing amplifier SA, sensing the increase in the voltage, determines the respective cell 20-S as being programmed.

Figure 30:
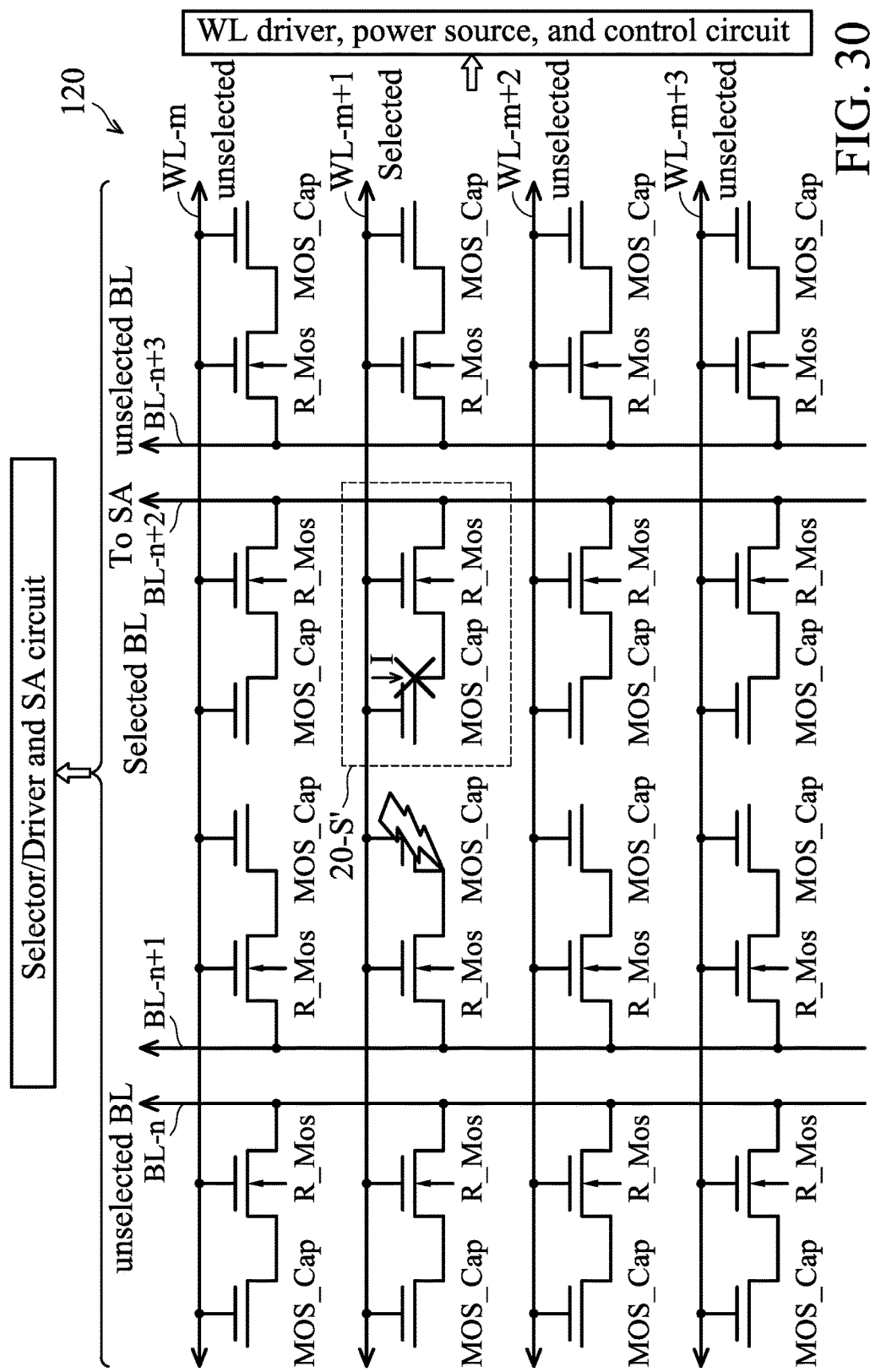

FIG. 30 illustrates the read operation of an un-programmed cell 20-S', which is connected to word-line WL-m+1 and bit-line BL-n+2. The selected word-line WL-m+1 is applied with a voltage of 0.8V~1.8V, and the selected bit-line BL-n+2 may be pre-charged to 0V. Accordingly, the R_MOS device in the selected cell 20-S is fully turned on. Since the gate dielectric of the MOS_Cap is not broken down, no current flows through the MOS_Cap in the un-programmed cell 20-S'. Bit-line BL-n+2 is hence not charged, and the respective voltage remains to be 0V. The sensing amplifier SA, sensing the voltage of 0V, may determine the respective cell 20-S' as being un-programmed.

The embodiments of the present disclosure have some advantageous features. The reading device R_MOS and the programming capacitor (MOS_Cap or Pro_MOS) in a same anti-fuse cell are connected to the same word line. Accordingly, the structure and the operation of the anti-fuses are simplified. The sizes of the respective macro are also reduced. A single word-line control circuit may be used. Furthermore, the reading device R_MOS and the programming capacitor in the same anti-fuse cell share a same active region and a same P_well region, and hence the size of the anti-fuse cell is reduced.

In accordance with some embodiments of the present disclosure, a structure includes a word-line, a bit-line, and an anti-fuse cell. The anti-fuse cell includes a reading device, which includes a first gate electrode connected to the word-line, a first gate dielectric underlying the first gate electrode, a drain region connected to the bit-line, and a source region. The first gate dielectric has a first thickness. The drain region and the source region are on opposite sides of the first gate electrode. The anti-fuse cell further includes a programming device including a second gate electrode connected to the word-line, and a second gate dielectric underlying the second gate electrode. The second gate dielectric has a second thickness smaller than the first thickness. The programming device further includes a source/drain region connected to the source region of the reading device.

In accordance with some embodiments of the present disclosure, a structure includes a word-line extending in a first direction, a bit-line extending in a second direction perpendicular to the first direction, an active region extending in the second direction, and an anti-fuse cell. The anti-fuse cell includes a reading device and a programming device. The reading device includes a first gate dielectric having a first thickness on sidewalls and a top surface of the active region, a first gate electrode over the first gate dielectric and extending in the first direction, wherein the first gate electrode is connected to the word-line, a drain region connected to the bit-line, and a source region. The drain region and the source region are on opposite sides of the first gate electrode. The programming device includes a second gate dielectric on a sidewall and a top surface of the active region, a second gate electrode over the second gate dielectric and extending in the first direction, a source/drain region connected to the first source region, and a channel region overlapped by the second gate electrode. The second gate electrode is connected to the word-line. The channel region and the source/drain region are of a same conductivity type. The second gate dielectric has a second thickness smaller than the first thickness.

In accordance with some embodiments of the present disclosure, a method includes programming an array, wherein the array has a plurality of anti-fuse cells arranged as rows and columns. Each of the plurality of anti-fuse cells has a reading device and a programming device. The programming includes applying a first voltage to a word-line connected to a first gate of the reading device and a second gate of the programming device, wherein the reading device and the programming device are in a selected cell. The programming further includes applying a second voltage to a drain region of the reading device. The first voltage and the second voltage in combination result in breakdown of a first gate dielectric in the programming device. A second gate dielectric in the reading device remains not broken down by the first voltage and the second voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a word-line;
a bit-line; and
an anti-fuse cell comprising:
  a reading device comprising:
    a first gate electrode connected to the word-line;
    a first gate dielectric underlying the first gate electrode, wherein the first gate dielectric has a first thickness;
    a drain region connected to the bit-line; and
    a source region, wherein the drain region and the source region are on opposite sides of the first gate electrode; and
  a programming device comprising:
    a second gate electrode connected to the word-line;
    a second gate dielectric underlying the second gate electrode, wherein the second gate dielectric has a second thickness smaller than the first thickness; and
    a first source/drain region connected to the source region: and
    a second source/drain region, wherein the first source/drain region and the second source/drain region are on opposite sides of the second gate electrode.

2. The structure of claim 1, wherein the drain region of the reading device, the source region of the reading device, and the first source/drain region of the programming device are in a same p-well region.

3. The structure of claim 1, wherein a channel region directly underlying the second gate electrode is doped as a same conductivity type as the first source/drain region of the programming device.

4. The structure of claim 1, wherein the first source/drain region of the programming device and a channel region directly underlying the second gate electrode are doped to different conductivity types.

5. The structure of claim 1, wherein the reading device is a Fin Field-Effect Transistor (FinFET), and the programming device is a fin-based device.

6. The structure of claim 1, wherein the first gate dielectric and the second gate dielectric are formed on a same semiconductor active region.

7. The structure of claim 1, wherein the programming device has no second source/drain region.

8. A structure comprising:
a word-line extending in a first direction;
a bit-line extending in a second direction perpendicular to the first direction;
an active region extending in the second direction;
an anti-fuse cell comprising:
  a reading device comprising:
    a first gate dielectric having a first thickness on sidewalls and a top surface of the active region;
    a first gate electrode over the first gate dielectric and extending in the first direction, wherein the first gate electrode is connected to the word-line;
    a drain region connected to the bit-line; and
    a source region, wherein the drain region and the source region are on opposite sides of the first gate electrode; and
  a programming device comprising:
    a second gate dielectric on a sidewall and a top surface of the active region, wherein the second gate dielectric has a second thickness smaller than the first thickness;
    a second gate electrode over the second gate dielectric and extending in the first direction, wherein the second gate electrode is connected to the word-line;
    a source/drain region connected to the source region; and
    a channel region overlapped by the second gate electrode, wherein the channel region and the source/drain region are of a same conductivity type.

9. The structure of claim 8 further comprising a connection module connecting the first gate electrode of the reading device and the second gate electrode of the programming device to the word-line.

10. The structure of claim 8, wherein the active region has an end overlapped by the second gate electrode of the programming device, and the active region is on a first side of the second gate electrode of the programming device, and not on a second side of the second gate electrode of the programming device, with the first side and the second side being opposite sides.

11. The structure of claim 8, wherein the active region has portions on opposite sides of the second gate electrode of the programming device.

12. The structure of claim 8, wherein the first thickness is greater than the second thickness by greater than about 50 percent.

13. The structure of claim 8 further comprising a dummy gate electrode, wherein an end of the active region is overlapped by the dummy gate electrode.

14. The structure of claim 8 further comprising a circuit, wherein the circuit is configured to:
apply a first voltage to the word-line; and
apply a second voltage to a drain region of the reading device, wherein the first voltage and the second voltage in combination result in breakdown of the second gate dielectric, and the first gate dielectric is not broken down by the first voltage and the second voltage.

15. A method comprising:
programming an array, wherein the array comprises a plurality of anti-fuse cells arranged as rows and columns, and each of the plurality of anti-fuse cells comprises a reading device and a programming device, the programming comprising:
  applying a first voltage to a word-line connected to a first gate of the reading device and a second gate of the programming device, wherein the reading device and the programming device are in a selected cell; and
  applying a second voltage to a drain region of the reading device, wherein the first voltage and the second voltage in combination result in breakdown of a first gate dielectric in the programming device, and a second gate dielectric in the reading device remains not broken down by the first voltage and the second voltage; and
reading a cell in the array, wherein the reading comprises:
  applying a third voltage to the word-line, wherein the third voltage is configured not to break any gate dielectric in the array; and
  sensing a voltage on a bit-line, wherein the bit-line is connected to the drain region of the reading device.

16. The method of claim 15, wherein after the first gate dielectric is broken down, the second gate and a source region of the reading device is resistively connected.

17. The method of claim 15, wherein during the programming, unselected cells connected to unselected word-lines in the array are applied with a voltage of 0V, and bit-lines connected to unselected cells connected to the word-line are applied with a voltage equal to about a half of the first voltage.

18. The method of claim 15, wherein the programming device is a partial MOS capacitor.

19. The method of claim 15, wherein the programming device is a three-terminal MOS capacitor.

\* \* \* \* \*